(12) United States Patent
de Ridder et al.

(10) Patent No.: US 10,954,597 B2
(45) Date of Patent: Mar. 23, 2021

(54) ATOMIC LAYER DEPOSITION APPARATUS

(71) Applicant: ASM IP HOLDING B.V., Almere (NL)

(72) Inventors: Chris G. M. de Ridder, Almere (NL); Lucian C. Jdira, Almere (NL); Bert Jongbloed, Almere (NL); Jeroen A. Smeltink, Almere (NL)

(73) Assignee: ASM IP HOLDING B.V., Almere (NL)

( * ) Notice: Subject to any disclaimer, the term of this patent is extended or adjusted under 35 U.S.C. 154(b) by 443 days.

(21) Appl. No.: 14/660,315

(22) Filed: Mar. 17, 2015

(65) Prior Publication Data
US 2016/0273105 A1    Sep. 22, 2016

(51) Int. Cl.
*C23C 16/458* (2006.01)
*C23C 16/44* (2006.01)
(Continued)

(52) U.S. Cl.
CPC ...... *C23C 16/4584* (2013.01); *C23C 16/4412* (2013.01); *C23C 16/455* (2013.01);
(Continued)

(58) Field of Classification Search
None
See application file for complete search history.

(56) References Cited

U.S. PATENT DOCUMENTS 4,413,022 A * 11/1983 Suntola .................. C23C 16/303
118/715
4,605,233 A * 8/1986 Sato .......................... F16J 15/43
277/410
(Continued)

FOREIGN PATENT DOCUMENTS

| JP | 5764246 B1 * | 8/2015 | ....... C23C 16/45561 |
| JP | 2015142038 A * | 8/2015 | ....... C23C 16/45565 |

(Continued)

OTHER PUBLICATIONS

FerroTec Corporation. Vacuum Rotary Feedthroughs: Catalog & Products Specification. 2001. pp. 1-16. (Year: 2001).*
(Continued)

*Primary Examiner* — Jeffrie R Lund
*Assistant Examiner* — Stanislav Antolin
(74) *Attorney, Agent, or Firm* — Preti Flaherty Beliveau & Pachios LLP

(57) ABSTRACT

An atomic layer deposition apparatus including a deposition head that is rotatably mounted around a central deposition head axis and including a susceptor having an upper surface for carrying substrates. The lower surface comprises a plurality of process sections. Each process section includes a purge gas injection zone, a first precursor gas injection zone, a gas exhaust zone, a purge gas injection zone, a second precursor gas injection zone and a gas exhaust zone. Each zone radially extends from a radially inward part of the lower surface to a radially outward part of the lower surface of the deposition head. The combination of distance between the lower surface and the upper surface, the rotational speed of the deposition head and the flow rate and the pressure of the purge gas flows are selected such that the first and second precursor gases are substantially prevented from mixing.

31 Claims, 16 Drawing Sheets

(51) Int. Cl.
*C23C 16/455* (2006.01)
*C30B 25/14* (2006.01)
*C30B 25/16* (2006.01)
*H01L 21/02* (2006.01)
*H01J 37/32* (2006.01)
*F16J 15/43* (2006.01)

(52) U.S. Cl.
CPC .. *C23C 16/45525* (2013.01); *C23C 16/45548* (2013.01); *C23C 16/45551* (2013.01); *C23C 16/45561* (2013.01); *C23C 16/45563* (2013.01); *C23C 16/45565* (2013.01); *C23C 16/45574* (2013.01); *C30B 25/14* (2013.01); *C30B 25/165* (2013.01); *H01J 37/3244* (2013.01); *H01J 37/32513* (2013.01); *H01L 21/0228* (2013.01); *F16J 15/43* (2013.01); *H01J 2237/20214* (2013.01)

(56) References Cited

U.S. PATENT DOCUMENTS

| | | | |
|---|---|---|---|
| 5,314,538 A | 5/1994 | Maeda et al. | |
| 6,203,619 B1* | 3/2001 | McMillan | H01L 21/6719 118/50 |
| 6,239,043 B1* | 5/2001 | Lai | C23C 16/45565 257/E21.279 |
| 6,289,842 B1* | 9/2001 | Tompa | C23C 16/4411 118/715 |
| 6,305,694 B1* | 10/2001 | Yamazumi | F16J 15/43 277/410 |
| 6,543,782 B1* | 4/2003 | Rosensweig | F16J 15/43 277/410 |
| 6,634,314 B2 | 10/2003 | Hwang et al. | |
| 6,656,284 B1* | 12/2003 | Hwang | C23C 16/45574 118/503 |
| 6,736,402 B1* | 5/2004 | Li | F16J 15/004 277/410 |
| 6,821,563 B2 | 11/2004 | Yudovsky | |
| 6,857,635 B1* | 2/2005 | Li | F16J 15/062 277/410 |
| 7,456,429 B2 | 11/2008 | Levy | |
| 7,785,664 B2 | 8/2010 | Seo et al. | |
| 8,092,598 B2 | 1/2012 | Baek et al. | |
| 8,105,647 B2 | 1/2012 | Lee et al. | |
| 8,882,915 B2 | 11/2014 | Kato et al. | |
| 8,992,685 B2* | 3/2015 | Kato | H01L 21/67109 118/719 |
| 2001/0007244 A1* | 7/2001 | Matsuse | C23C 16/45519 118/719 |
| 2001/0045705 A1* | 11/2001 | Hashimoto | F16J 15/3236 277/558 |
| 2002/0043216 A1* | 4/2002 | Hwang | C23C 16/45525 118/723 VE |
| 2002/0139307 A1* | 10/2002 | Ryding | H01L 21/67109 118/730 |
| 2003/0044533 A1* | 3/2003 | Lee | C23C 16/30 427/255.28 |
| 2004/0058293 A1* | 3/2004 | Nguyen | C23C 16/45525 432/129 |
| 2004/0173972 A1* | 9/2004 | Li | F16J 15/43 277/500 |
| 2004/0195540 A1* | 10/2004 | Tsuda | H01F 1/44 252/62.52 |
| 2004/0216668 A1* | 11/2004 | Lindfors | C23C 16/4412 118/715 |
| 2004/0255858 A1* | 12/2004 | Lee | C23C 16/4401 118/715 |
| 2005/0072358 A1* | 4/2005 | Katsuoka | H01L 21/67196 118/719 |
| 2005/0084610 A1* | 4/2005 | Selitser | C23C 16/45519 427/248.1 |
| 2006/0043682 A1* | 3/2006 | Li | F16J 15/43 277/410 |
| 2006/0073276 A1* | 4/2006 | Antonissen | C23C 16/4412 427/248.1 |
| 2006/0090705 A1* | 5/2006 | Kim | C23C 14/046 118/726 |
| 2006/0219362 A1* | 10/2006 | Han | H01J 37/3244 156/345.33 |
| 2006/0225649 A1* | 10/2006 | Courville | C23C 16/455 118/715 |
| 2006/0273673 A1* | 12/2006 | Yamamura | F16C 33/1035 310/90 |
| 2007/0095286 A1* | 5/2007 | Baek | F16J 15/43 277/410 |
| 2007/0169687 A1* | 7/2007 | Kordina | C30B 25/00 117/88 |
| 2007/0228470 A1* | 10/2007 | Levy | C23C 16/45525 257/348 |
| 2007/0234957 A1* | 10/2007 | Lee | C23C 16/402 118/715 |
| 2008/0096369 A1* | 4/2008 | Strzyzewski | C23C 16/45551 438/478 |
| 2008/0226842 A1* | 9/2008 | Vukovic | C23C 16/45551 427/595 |
| 2009/0061083 A1* | 3/2009 | Chiang | C23C 16/45544 427/248.1 |
| 2009/0061644 A1* | 3/2009 | Chiang | C23C 16/402 118/715 |
| 2009/0061646 A1* | 3/2009 | Chiang | C23C 16/45544 438/763 |
| 2009/0304924 A1* | 12/2009 | Gadgil | C23C 16/4412 427/255.5 |
| 2010/0041213 A1* | 2/2010 | Lee | C23C 16/45551 438/478 |
| 2010/0050942 A1* | 3/2010 | Kato | C23C 16/401 118/730 |
| 2010/0050943 A1* | 3/2010 | Kato | F16J 15/004 277/410 |
| 2010/0055297 A1* | 3/2010 | Kato | F16J 15/43 277/500 |
| 2010/0055316 A1* | 3/2010 | Honma | C23C 16/45551 427/255.28 |
| 2010/0055319 A1* | 3/2010 | Kato | F16J 15/062 277/410 |
| 2010/0116209 A1* | 5/2010 | Kato | C23C 16/45551 118/730 |
| 2010/0116210 A1* | 5/2010 | Kato | C23C 16/4584 118/730 |
| 2010/0122710 A1* | 5/2010 | Kato | B08B 7/0035 134/1 |
| 2010/0132614 A1* | 6/2010 | Kato | F16J 15/43 277/410 |
| 2010/0147396 A1* | 6/2010 | Yamagishi | C23C 16/54 137/15.01 |
| 2010/0186669 A1* | 7/2010 | Shin | C23C 16/45546 118/719 |
| 2010/0190341 A1* | 7/2010 | Park | C23C 16/045 438/694 |
| 2010/0227059 A1* | 9/2010 | Kato | C23C 16/45551 427/255.28 |
| 2010/0229797 A1* | 9/2010 | Kato | H01L 21/68764 118/730 |
| 2010/0230901 A1* | 9/2010 | Brooks | F16J 15/43 277/317 |
| 2010/0260935 A1* | 10/2010 | Kato | C23C 16/402 427/255.28 |
| 2010/0260936 A1* | 10/2010 | Kato | H01L 21/67109 427/255.28 |
| 2010/0310771 A1* | 12/2010 | Lee | C23C 16/32 427/255.28 |
| 2011/0036291 A1* | 2/2011 | Jauhiainen | C23C 16/45544 118/715 |
| 2011/0039026 A1* | 2/2011 | Kato | C23C 16/402 427/255.26 |
| 2011/0083735 A1* | 4/2011 | Park | C23C 16/308 136/256 |
| 2011/0155056 A1* | 6/2011 | Kato | C23C 16/45538 118/719 |

(56) References Cited

U.S. PATENT DOCUMENTS

| | | | |
|---|---|---|---|
| 2011/0159187 A1* | 6/2011 | Kato | C23C 16/45544 427/255.26 |
| 2011/0212625 A1* | 9/2011 | Toyoda | C23C 16/4412 438/758 |
| 2011/0214611 A1* | 9/2011 | Kato | C23C 16/45519 118/719 |
| 2011/0223334 A1* | 9/2011 | Yudovsky | C23C 16/45504 427/255.23 |
| 2011/0239940 A1* | 10/2011 | Benvenuti | F16C 33/1035 310/90 |
| 2012/0049871 A1* | 3/2012 | Raj | F16J 15/43 324/722 |
| 2012/0064698 A1* | 3/2012 | Olgado | C23C 16/45565 438/478 |
| 2012/0094011 A1* | 4/2012 | Hishiya | C23C 16/45548 427/8 |
| 2012/0135145 A1* | 5/2012 | Je | C23C 16/45565 427/248.1 |
| 2012/0149209 A1* | 6/2012 | Haywood | C23C 16/04 438/758 |
| 2012/0152171 A1* | 6/2012 | Lee | C23C 16/45551 118/730 |
| 2012/0152172 A1* | 6/2012 | Hwang | C23C 16/45551 118/730 |
| 2012/0222616 A1* | 9/2012 | Han | C23C 16/4401 118/723 E |
| 2012/0312231 A1* | 12/2012 | Li | C23C 16/303 118/715 |
| 2013/0026722 A1* | 1/2013 | McRay | H01L 21/68792 279/157 |
| 2013/0036970 A1* | 2/2013 | Choi | C23C 16/4584 118/500 |
| 2013/0061804 A1* | 3/2013 | Enomoto | H01L 21/6719 118/719 |
| 2013/0118407 A1* | 5/2013 | Park | C23C 16/45551 118/725 |
| 2013/0180452 A1* | 7/2013 | Kato | C23C 16/458 118/719 |
| 2013/0189849 A1* | 7/2013 | Kato | H01L 21/0206 438/758 |
| 2013/0192761 A1* | 8/2013 | Yudovsky | C23C 16/54 156/345.55 |
| 2013/0206067 A1* | 8/2013 | Kato | H01L 21/02104 118/719 |
| 2013/0210238 A1* | 8/2013 | Yudovsky | H01L 21/02104 438/758 |
| 2013/0260488 A1* | 10/2013 | Kim | C23C 16/45508 438/26 |
| 2013/0273262 A1* | 10/2013 | Vellaikal | C23C 16/45565 427/569 |
| 2013/0333620 A1* | 12/2013 | Li | C23C 16/45563 118/728 |
| 2014/0120257 A1* | 5/2014 | Ripley | C23C 16/455 427/255.28 |
| 2014/0147587 A1* | 5/2014 | Endo | B05D 1/32 427/240 |
| 2014/0174362 A1* | 6/2014 | Kao | C23C 16/45565 118/723 R |
| 2014/0209028 A1* | 7/2014 | Oshimo | H01L 21/68764 118/730 |
| 2014/0224177 A1* | 8/2014 | Park | H01J 37/3244 118/730 |
| 2014/0242814 A1* | 8/2014 | Karakawa | H01L 21/0217 438/792 |
| 2015/0030766 A1* | 1/2015 | Lind | C23C 16/4405 427/209 |
| 2015/0048739 A1* | 2/2015 | Forster | H01J 37/32357 315/111.21 |
| 2015/0136028 A1* | 5/2015 | Park | C23C 16/45551 118/730 |
| 2015/0147889 A1* | 5/2015 | Yudovsky | H01L 21/0228 438/758 |
| 2015/0211119 A1* | 7/2015 | Ono | C23C 16/45565 118/725 |
| 2015/0225848 A1* | 8/2015 | Han | H01L 21/68764 427/569 |
| 2015/0236566 A1* | 8/2015 | Yudovsky | H02K 7/14 156/345.51 |
| 2015/0299855 A1* | 10/2015 | Yudovsky | C23C 16/52 427/8 |
| 2015/0299856 A1* | 10/2015 | Li | C23C 16/45534 216/37 |
| 2015/0345022 A1* | 12/2015 | Yudovsky | C23C 16/45551 438/14 |
| 2015/0361553 A1* | 12/2015 | Murakawa | C23C 16/4412 156/345.55 |
| 2015/0368798 A1* | 12/2015 | Kwong | C23C 16/45544 118/729 |
| 2015/0376786 A1* | 12/2015 | Yudovsky | C23C 16/45551 118/730 |
| 2015/0380221 A1* | 12/2015 | Liu | C23C 16/45536 427/569 |
| 2016/0053373 A1* | 2/2016 | Inada | H01L 21/32051 118/719 |
| 2016/0060759 A1* | 3/2016 | Kim | C23C 16/45574 239/296 |
| 2016/0068952 A1* | 3/2016 | Sasaki | C23C 16/4412 156/345.29 |
| 2016/0068953 A1* | 3/2016 | Li | C23C 16/4412 118/712 |
| 2016/0083844 A1* | 3/2016 | Nishitani | C23C 16/45561 118/719 |
| 2016/0099143 A1* | 4/2016 | Yan | C23C 16/402 438/782 |
| 2016/0215392 A1* | 7/2016 | Yudovsky | C23C 16/45551 |
| 2016/0217999 A1* | 7/2016 | Sato | H01L 21/0228 |
| 2016/0273105 A1* | 9/2016 | de Ridder | F16J 15/43 324/722 |
| 2016/0276136 A1* | 9/2016 | Forster | C23C 16/402 118/715 |
| 2017/0092480 A1* | 3/2017 | Yi | C23C 16/4412 156/345.55 |
| 2019/0316255 A1* | 10/2019 | Shugrue | C23C 16/45565 |

FOREIGN PATENT DOCUMENTS

| | | | |
|---|---|---|---|
| JP | 2016065268 A * | 4/2016 | C23C 16/45561 |
| KR | 10-2004-0106963 | 12/2004 | |
| KR | 100558922 B1 * | 3/2006 | C23C 16/4412 |
| KR | 10-2006-0067166 | 7/2006 | |
| KR | 100722848 B1 * | 5/2007 | |
| KR | 10-2007-0136921 | 12/2007 | |
| KR | 10-2008-0018359 | 2/2008 | |
| KR | 20080018359 A * | 2/2008 | |
| KR | 20090069076 A * | 6/2009 | |
| KR | 100960958 B1 * | 6/2010 | |
| KR | 10-2010-0103872 | 10/2010 | |
| KR | 101095687 B1 * | 12/2011 | C23C 16/45561 |
| KR | 20120070195 A * | 6/2012 | C23C 16/00 |
| KR | 20160026494 A * | 3/2016 | C23C 16/45574 |
| KR | 20160089657 A * | 7/2016 | C23C 16/45574 |
| WO | WO 9920433 A1 * | 4/1999 | F04D 19/04 |
| WO | WO 2007087589 A2 * | 8/2007 | C30B 25/00 |
| WO | WO-2011004987 A2 * | 1/2011 | C23C 16/45565 |
| WO | WO 2012176996 A2 * | 12/2012 | H01J 37/3244 |
| WO | WO 2014/127363 | 8/2014 | |
| WO | WO 2014/130670 | 8/2014 | |
| WO | WO 2014127363 A1 * | 8/2014 | C23C 16/45544 |
| WO | WO 2014130670 A1 * | 8/2014 | C23C 16/45551 |
| WO | WO-2014130673 A1 * | 8/2014 | C23C 16/45551 |
| WO | WO-2014168096 A1 * | 10/2014 | C23C 16/45561 |
| WO | WO-2015023945 A1 * | 2/2015 | H01J 37/32357 |

OTHER PUBLICATIONS

FerroTec Corporation. Ferrofluidic® Vacuum Rotary Feedthroughs Catalog. 2003. pp. 1-15. (Year: 2003).*

(56) References Cited

OTHER PUBLICATIONS

FerroTec Corporation. Vacuum Rotary Feedthroughs: Catalog & Products Specification. 2010. pp. 1-28. (Year: 2010).*
FerroTec (USA) Corporation. Ferrofluidic Seals & Vacuum Rotary Feedthrough Solutions: Standard Products Catalog. 2012. pp. 1-97. (Year: 2012).*
Rigaku Corporation. Vacuum Products Catalog: Magnetic Rotary Motion Feedthrough Units. 2008. pp. 1-71. (Year: 2008).*

* cited by examiner

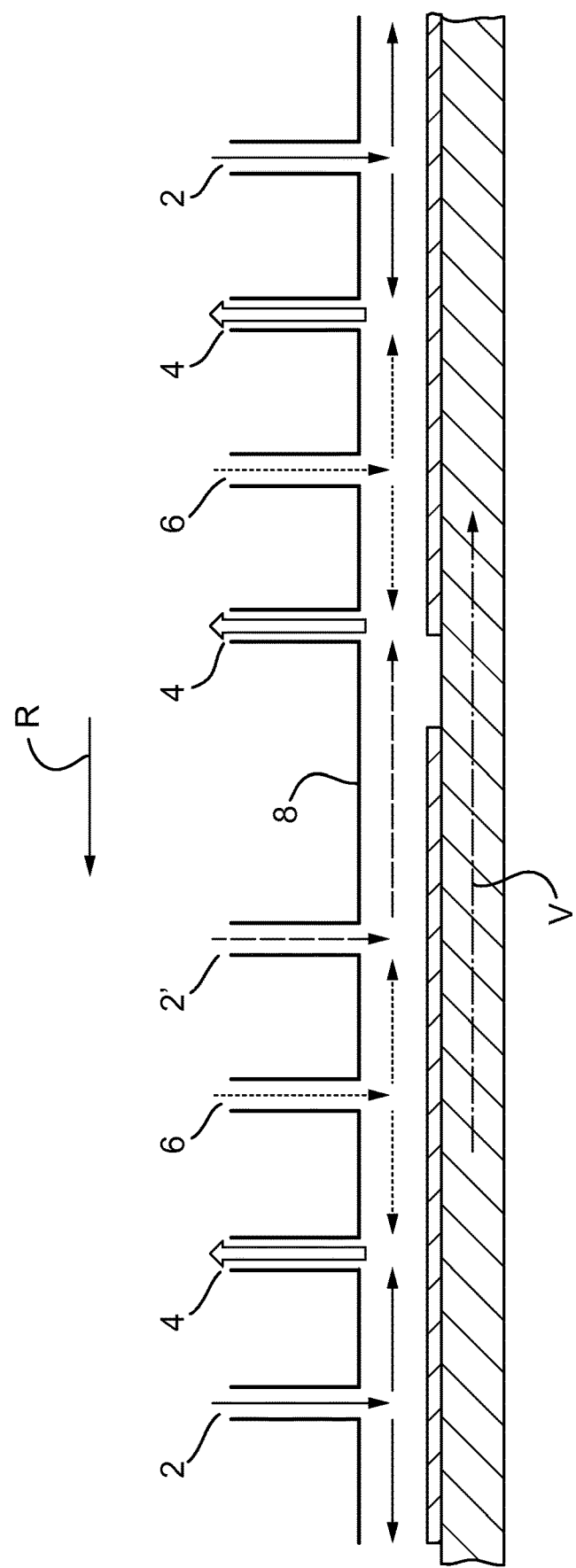

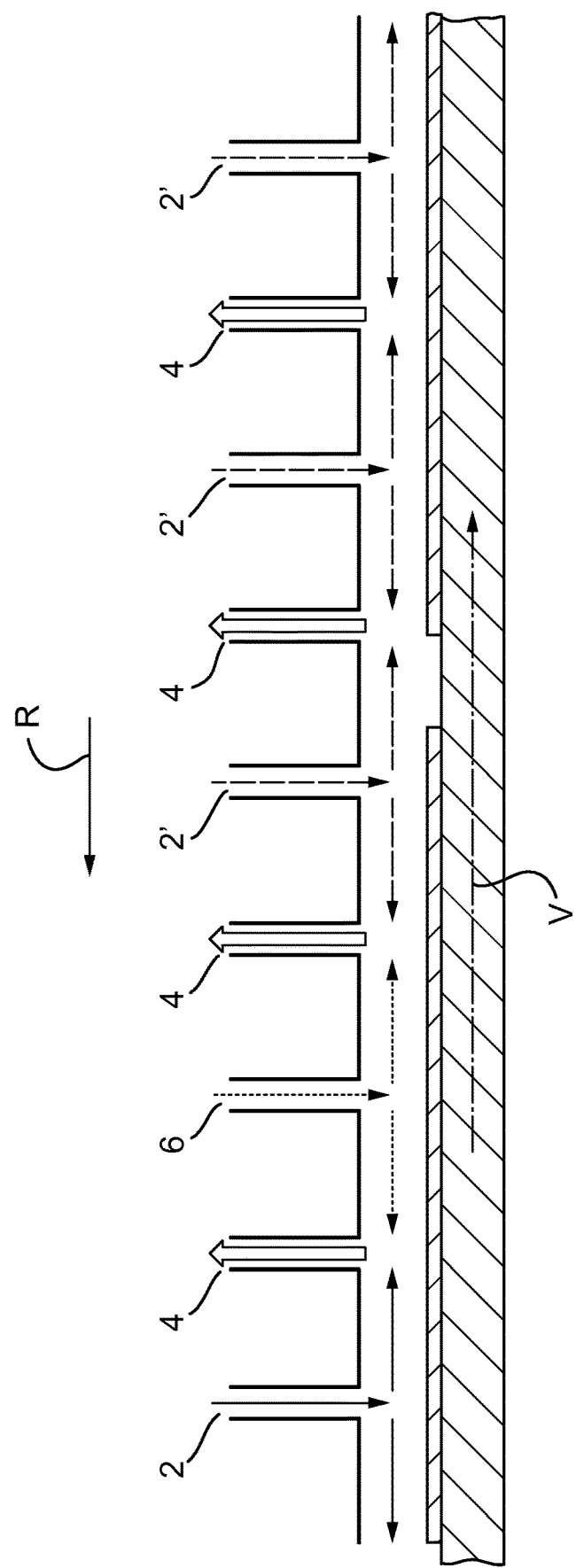

ATOMIC LAYER DEPOSITION APPARATUS

FIELD

The invention relates to an atomic layer deposition apparatus and more specifically to an atomic layer deposition apparatus with a rotating deposition head.

BACKGROUND

Atomic layer deposition (or ALD) is known in the art, for example for processing semiconductor substrates. Most atomic layer deposition apparatus in the prior art are configured for sequential or time-divided processing. In sequential processing one or more substrates are inserted in a processing chamber of the atomic layer deposition apparatus. The substrates are then cyclically exposed to two or more different precursor gases in sequential and alternating exposure steps. Herein, under precursor gas will be understood all process gases being chemically involved in the film deposition process and excluding purge gases, carrier gases etc. Each exposure step comprises exposing the substrate(s) to one precursor gas and chemisorbing the precursor gas onto the substrate surface. Between the exposure steps, the processing chamber is purged using purge gas to drain all precursor gases from the processing chamber. The sequential ALD-process provides relatively high-quality films. However, a disadvantage of the sequential atomic layer deposition apparatus is the relatively long processing time required for processing the one or more substrates due to the repeated purging of the reaction space.

U.S. Pat. No. 6,821,563 discloses an atomic layer deposition apparatus comprising a circular processing chamber that encloses a wheel with a number of radial spokes each having a substrate carrier at its outer extremity. Each substrate carrier is configured to carry a substrate on an upward facing substrate supporting surface. The wheel with the plurality of substrate carriers is rotatable around a substrate carrier axis. The known system further includes a module that includes a plurality of gas injection ports configured for injecting gas into the process chamber, and a plurality of gas exhaust ports configured to remove gas from the processing chamber and partitions. The plurality of gas injection ports and the plurality of gas exhaust ports are positioned such that, viewed in a tangential direction relative to the wheel axis, a succession of an exhaust port, a first precursor gas injection port, an exhaust port, a purge gas injection port, an exhaust port, a second precursor gas injection port, an exhaust port and a purge gas injection port are disposed. By rotation of the wheel, the substrate carriers are moved underneath the module and pass the gas injection ports and the exhaust ports, such that the substrates are successively exposed to the gases that are injected from the gas injection ports into the processing chamber. The gases are transported out of the processing chamber by means of the exhaust ports that are positioned between the gas injection ports. With this configuration, an atomic layer deposition process may be executed thereby depositing successive atomic layers on the substrates.

A disadvantage of the apparatus known from U.S. Pat. No. 6,821,563 is that the rotation of the wheel with the substrate carriers induces vibrations in the substrates on the substrate carrier. The vibrations may result in a non-uniform deposition on the substrates, leading to a lower quality.

Another disadvantage of the rotating substrate wheel with substrate carriers is that the rotation of the substrate carrier has to be decelerated and stopped when a new substrate has to be loaded on a substrate carrier of the wheel and subsequently has to be accelerated again. The acceleration and deceleration of the relatively heavy wheel with substrate carriers is disadvantageous from an energetic point of view. Additionally, the deceleration and acceleration is time consuming which reduces the production capacity of the device. Another disadvantage is the large diameter of the apparatus relative to the substrate diameter.

Yet another disadvantage of the known device is that the rotational speed of the substrate carrier is only variable within a limited range. When the rotational speed is too high, the substrates will move outwardly by virtue of the centrifugal force. To prevent this radially outward movement, U.S. Pat. No. 6,821,563 discloses to arrange the supporting surfaces on the carrier to be angled slightly radially inwards relative to the axis of rotation of the substrate carrier, so that on rotation, the substrates may be pressed firmly against the supporting surfaces through centrifugal force and the substrate is prevented from moving outwardly by increased friction forces. However, a pretty high angle of inclination will be needed when rotating at a speed of e.g. 1 rpm. in order to provide sufficient friction forces to stabilize the substrates. Furthermore, this arrangement makes placing the substrates on the substrate support surfaces more difficult and the inclination of the substrate carrier surface is related to a limited range of rotational speeds. Finally, when rotating a flat substrate in an inclined orientation under the gas injection/exhaust module, the gap between substrate and the module will not be constant. In view thereof, the flexibility of use of the known system is limited.

SUMMARY

An object of the invention is therefore to provide an atomic layer deposition apparatus that alleviates the disadvantages of the prior art device.

To that end, the invention provides an atomic layer deposition apparatus, comprising:
  a susceptor having an upper surface configured for supporting a plurality substrates;
  a deposition head mounted above the susceptor having a lower surface positioned opposite the upper surface of the susceptor, wherein the space between the upper and the lower surface is a process space for accommodating substrates to be processed, wherein the lower surface of the deposition head includes:
    a plurality of precursor gas injection zones wherein each precursor gas injection zone comprises a plurality of precursor gas injection openings configured to inject precursor gas into the process space;
    a plurality of gas exhaust zones wherein each gas exhaust zone comprises a plurality of gas exhaust openings configured to exhaust gas from the process space;
    a plurality of purge gas injection zones, wherein each purge gas injection zone comprises a plurality of purge gas injection openings configured to inject purge gas into the process space;
  wherein
    the deposition head is rotatably mounted around a central deposition head axis extending perpendicular relative to the upper surface;
    the precursor gas injection zones, the exhaust gas zones and the purge gas zones extend in a radial direction relative to the central deposition head axis;
    wherein the lower surface comprises at least one process section which each includes, when viewed along a tangential direction relative to the central deposition head axis, a purge gas injection zone, a first precursor gas injection zone, a gas exhaust zone, a purge gas injection zone, a second precursor gas injection zone and a gas exhaust zone;

wherein in use, during rotation of the deposition head relative to the susceptor and during injection of the first and the second precursor gases and the purge gas, the combination of distance between the lower surface and the upper surface, the rotational speed of the deposition head and the flow rate and the pressure of the purge gas flows are selected such that the first and second precursor gases are substantially prevented from mixing.

The atomic layer deposition apparatus according to the invention has the advantage that the susceptor and therewith the supported substrates are held substantially stationary during processing. As a result, the substrates are not subject to vibrations and a uniform deposition on the substrate surface is provided. This is achieved by providing a rotating deposition head that comprises at least one process sections that deposit successive atomic layers on the substrates.

During production, loading and unloading of substrates is possible without stopping rotation of the relatively heavy deposition head. Thus no energy is lost to decelerating and accelerating the deposition head which may rotate at a relatively high speed. In an embodiment, when the distance between the upper surface and the lower surface is sufficient, it might even be possible to load and unload substrates while the other substrates are undergoing the ALD-process. Such an embodiment would be highly advantageous for the production capacity. The device known from U.S. Pat. No. 6,821,563 must be a batch process because deceleration and acceleration of the entire wheel for one wafer would be very inefficient.

Various embodiments are claimed in the dependent claims, which will be further elucidated with reference to some examples shown in the figures. The embodiments may be combined or may be applied separate from each other.

BRIEF DESCRIPTION OF THE FIGURES

FIG. 9b shows a cross sectional view along line IX of FIG. 9a;

FIG. 10b shows a cross sectional view along line X of FIG. 10a;

FIG. 11b shows a cross sectional view along line XI of FIG. 11a;

DETAILED DESCRIPTION

Figure 1:
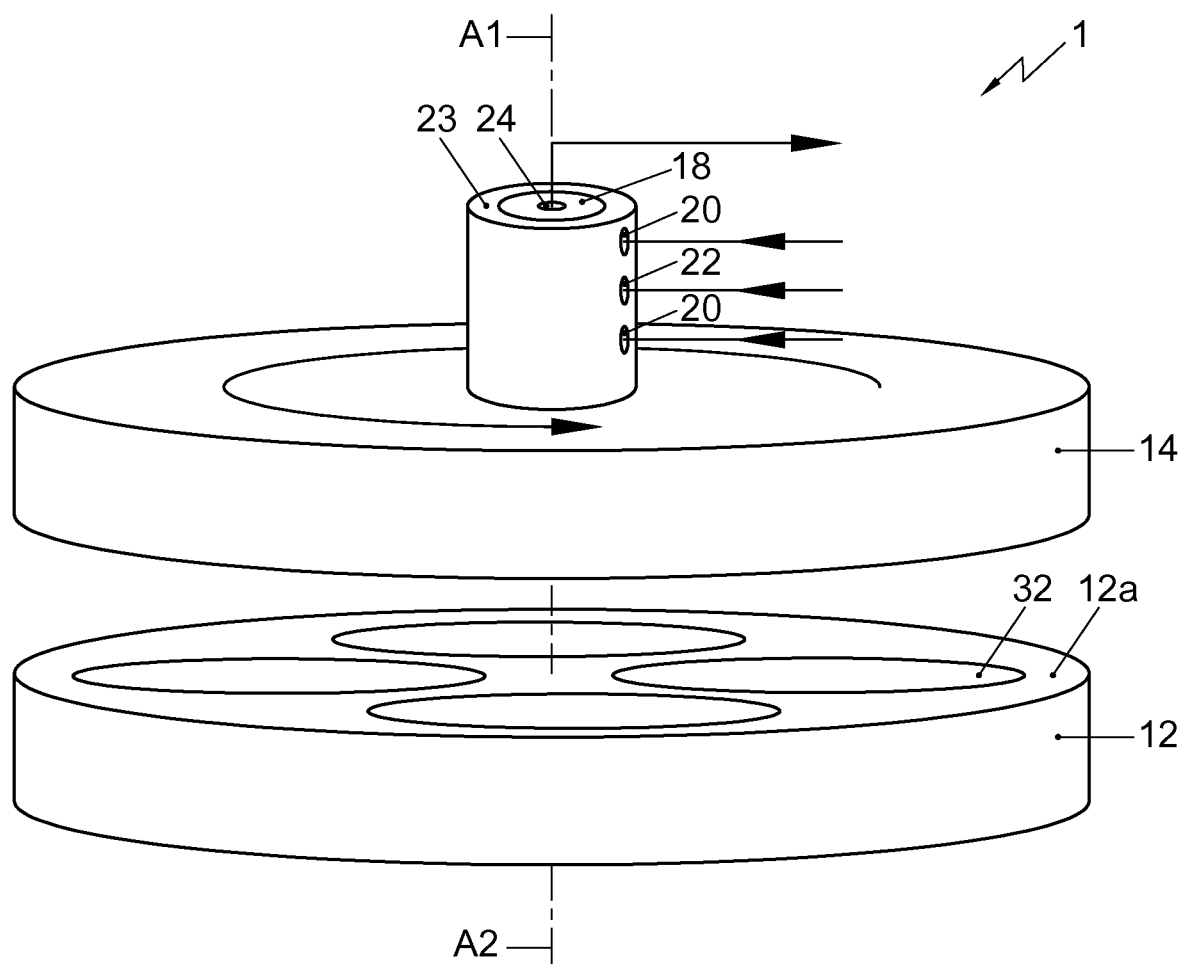
FIG. 1 is a perspective view of an example of an atomic layer deposition apparatus according to the invention, wherein the apparatus is in an opened position.

In this application similar or corresponding features are denoted by similar of corresponding reference signs. The description of the various embodiments is not limited to the examples shown in the figures and the reference numbers used in the detailed description and the claims are not intended to limit the description of the embodiments. The reference numbers are included to elucidate the embodiments by referring to the examples shown in the figures.

FIGS. 1-7 show various examples of atomic layer deposition apparatus (hereafter ALD-apparatus) in which various embodiments including the main aspect of the invention are present.

In general terms, the ALD-apparatus comprises a susceptor 12 having an upper surface 12a configured for supporting a plurality substrates S. A deposition head 14 is mounted above the susceptor 12 and has a lower surface 14a positioned opposite the upper surface 12a of the susceptor 12. The space between the upper surface 12a and the lower surface 14a is a process space 16 for accommodating substrates S to be processed. The lower surface 14a of the deposition head 14 includes a plurality of precursor gas injection zones 2, 2'. Each precursor gas injection zone 2, 2' comprises a plurality of precursor gas injection openings 3 configured to inject precursor gas into the process space 16. The lower surface 14a additionally includes a plurality of gas exhaust zones 4. Each gas exhaust zone 4 comprises a plurality of gas exhaust openings 5 configured to exhaust gas from the process space 16. Further, the lower surface 14a comprises a plurality of purge gas injection zones 6. Each purge gas injection zone 6 comprises a plurality of purge gas injection openings 7 configured to inject purge gas into the process space 16. The deposition head 14 is rotatably mounted around a central deposition head axis A1 extending perpendicular relative to the upper surface 12a and also perpendicular relative to the lower surface 14a. The precursor gas injection zones 2, 2', the exhaust gas zones 4 and the purge gas zones 6 extend in a radial direction relative to the central deposition head axis A1. The lower surface 14a comprises at least one process sections 34. Each process section 34 includes, when viewed along a tangential direction T relative to the central deposition head axis A1, a purge gas injection zone 6, a first precursor gas injection zone 2, a gas exhaust zone 4, a purge gas injection zone 6, a second precursor gas injection zone 2' and a gas exhaust zone 4. In use, during rotation of the deposition head 14 relative to the susceptor 12 and during injection of the first and the second precursor gases and the purge gas, the combination of distance between the lower surface and the upper surface, the rotational speed of the deposition head and the flow rate and the pressure of the purge gas flows are selected such that the first and second precursor gases are substantially prevented from mixing.

Various embodiments of such an ALD-apparatus are possible.

Each precursor gas injection zone 2, 2' and/or purge gas injection zone 6 may for example be provided with one or multiple rows of gas injection openings that extend substantially in a radial direction relative to the central deposition head axis A1. In addition, each gas exhaust zone 4 may comprise one or multiple adjacent rows of gas exhaust openings, wherein the rows extend substantially in a radial direction relative to the central deposition head axis A1 and preferably over an entire diameter of a substrate accommodated on the susceptor. The openings may, for example, be positioned in triangular or wedge shaped zones or may be positioned in radially extending rows located tangentially next to each other.

The pattern of openings and the size of the openings may be different for the different zones. E.g. the diameter of the gas exhaust openings may be larger than the diameter of the precursor gas openings or the diameter of the purge gas openings to minimize restriction of flow to the gas exhaust. Also the tangential width of the pattern of openings may be different for the different zones.

In an embodiment, of which examples are shown in FIGS. 6, 7, 8, 9a, 10a and 11a, the lower surface 14a of the deposition head 14 may comprise a first annular purge zone 6' that extends around the central axis in an area radially inward from the radially extending precursor gas injection zones 2, exhaust gas zones 4 and purge gas zones 6. Such an embodiment preferably also comprises a second annular purge zone 6" that extends around the central axis in an area radially outward from the radially extending precursor gas injection zones 2, exhaust gas zones 4 and purge gas zones 6. These annular purge zones 6', 6" prevent precursor gases from flowing out of the processing space and/or prevent the first and second precursor gases from mixing. Preferably, the annular purge gas zones are provided with a pattern of spaced apart purge gas injection openings 7 extending along an entire circumference of the annular purge gas zones 6' and 6". Examples of these annular purge gas zones 6', 6" are shown in FIGS. 6, 7, 8, 9a, 10a and 11a. It should be noticed that these figures also indicate the position of the substrates S. However, it should be noted that these substrates S are only shown here to indicate their position relative to the deposition head 14. In reality, the substrates S are not visible when looking at the lower surface of the deposition head 14 because the substrates are carried by the susceptor 12 which is not visible in FIGS. 6, 7, 8, 9a, 10a and 11a.

Figure 7:
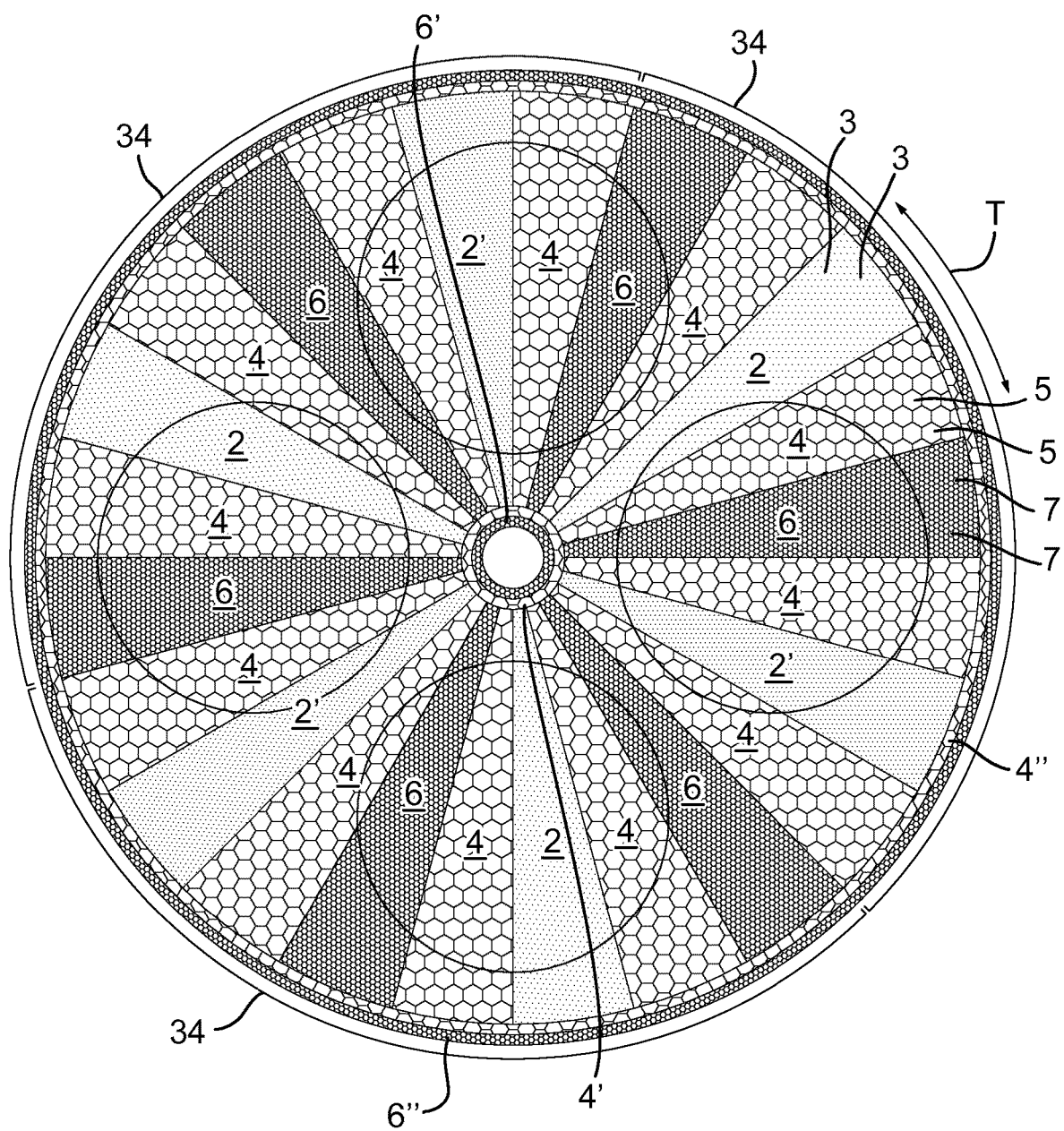
FIG. 7 shows a bottom view of a second example of the deposition head.

In an embodiment, of which an example is shown in FIG. 7, the lower surface 14a of the deposition head 14 may comprise a first annular exhaust zone 4' that extends around the central axis in an area radially inward from the radially extending precursor gas injection zones, exhaust gas zones 4 and purge gas zones 6. Such an embodiment may also comprise a second annular exhaust zone 4" that extends around the central axis A1 in an area radially outward from the radially extending precursor gas injections zones 2, exhaust gas zones 4 and purge gas zones 6. These annular exhaust zones 4', 4" prevent that precursor gases flow into the environment of the ALD-apparatus.

In an embodiment, of which examples are shown in FIGS. 6, 7, 8 9a and 10a, the deposition head 14 may comprise a plurality of process sections 34 that are, when viewed in said tangential direction, positioned successively in the lower surface 14a. A plurality of process sections 34 provides the possibility to apply multiple monolayers of atoms within one rotation of the deposition head 14. Thus, the rotational speed of the deposition head 14 may be reduced while still being able to deposit a large number of layers within a given time period. The examples of FIGS. 6-8 all show a deposition head 14 with three process sections 34.

Figure 10A:
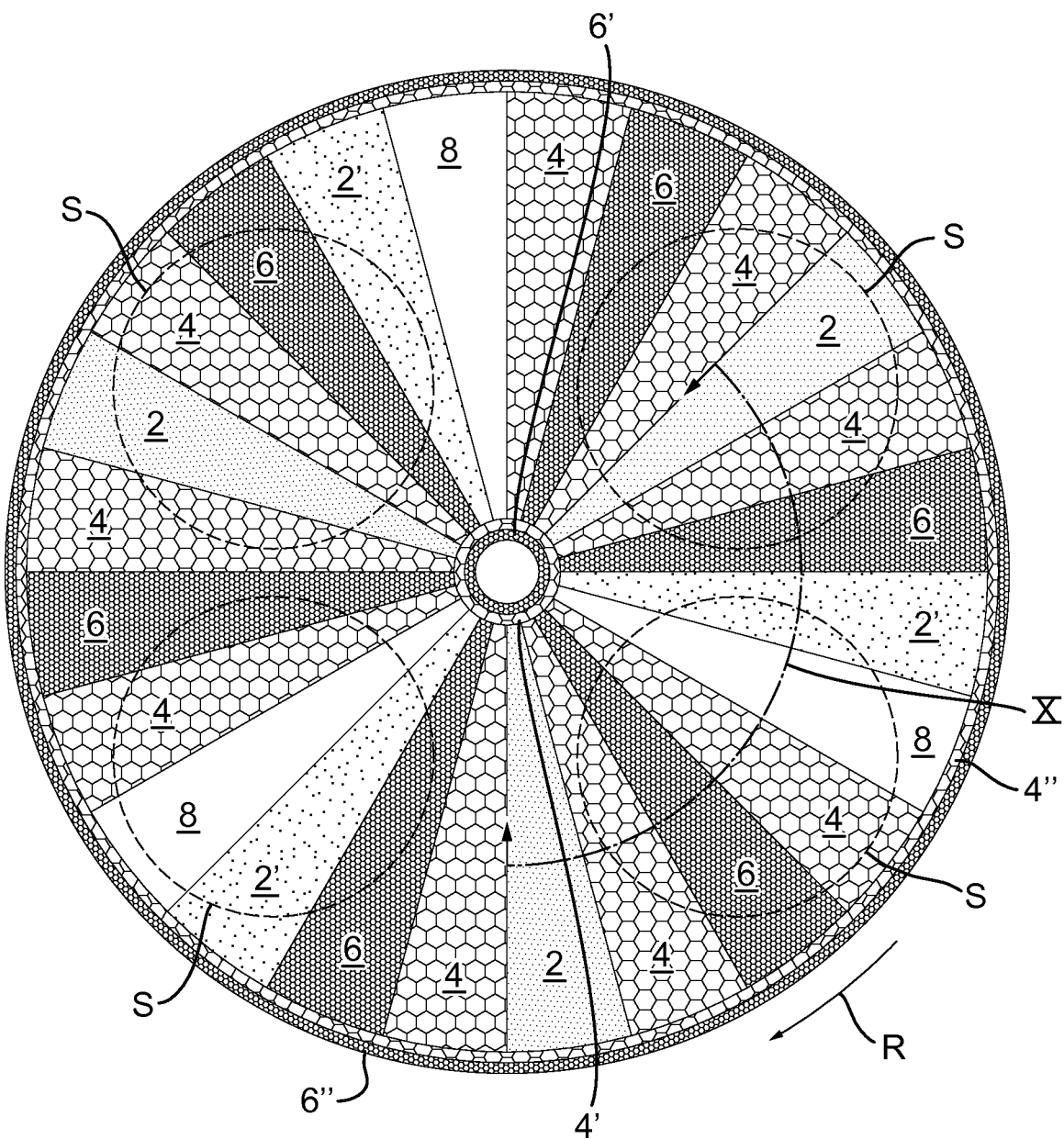
FIG. 10a shows a bottom view of an example of a deposition head having only separation zones directly upstream from the second precursor gas injection zones.

In an embodiment, of which an example is shown in FIGS. 10a and 10b, at a given radius of the deposition head 14, the tangential distance between a precursor gas injection zone 2, 2' and an adjacent gas exhaust zone 4 may be larger than the tangential distance between a purge gas injection zone 6 and an adjacent gas exhaust zone 4 at said given radius.

By virtue of the increased tangential distance between a precursor gas injection zone 2, 2' and an adjacent gas exhaust zone 4 the deposition path length is increased. As a result, the injected precursor gases have an increased residence time in the process space 16, which may provide an increased deposition efficiency.

In an embodiment, the purge gas injection zone 6, the first precursor gas injection zone 2, the gas exhaust zone 4, the purge gas injection zone 6, the second precursor gas injection zone 2' and a gas exhaust zone 4 are successively arranged in each process section without the interposition of any additional gas injection zone and gas exhaust zone.

An advantage of this embodiment is that a reduced amount of precursor gas is required to be injected into the process space to deposit the subsequent layers on the substrate. This is achieved by positioning the precursor gas injection zones directly adjacent to the purge gas injection zones (i.e. by not having a gas exhaust zone in between), when viewed along a tangential direction relative to the central deposition head axis. As a result, less precursor gas is removed from the process chamber in the gas exhaust zone and the total flow of injected precursor gas may be reduced relative to the known ALD-systems in which each precursor gas injection opening always has two neighboring exhaust openings on opposite sides of the precursor gas injection opening. The mixing of precursor gases by back diffusion (i.e. diffusion in the direction opposite the direction of rotation) is prevented by purge gas flows.

In an alternative embodiment, of which examples are shown in FIGS. 6-8, 9a, 10a and 11a, each of the process sections may include an additional gas exhaust zone 4 that, when viewed along a tangential direction relative to the central deposition head axis A1, may be positioned between a purge gas zone 6 and a successive first precursor gas zone 2. Alternatively or additionally, each of the process sections may include an additional gas exhaust zone 4 that, when viewed along a tangential direction relative to the central deposition head axis A1, may be positioned between a purge gas zone 6 and a successive second precursor gas zone 2'.

Depending on the characteristics of the precursor gases used in the deposition process it may be advantageous to provide an additional gas exhaust zone 4 that is positioned between a purge gas injection zone 6 and an adjacent first and/or second precursor gas injection zone 2, 2'. This would in particular be applicable for precursor gases that are cheap and for which it is no problem to maintain a high flow. It has the further advantage of not diluting the precursor gas with purge gas.

In an embodiment, at a given radius, the tangential distance between the second precursor gas injection zone 2' and an adjacent gas exhaust zone 4 may be substantially equal to the tangential distance between a purge gas injection zone 6 and an adjacent gas exhaust zone 4 at said given radius.

Figure 8:
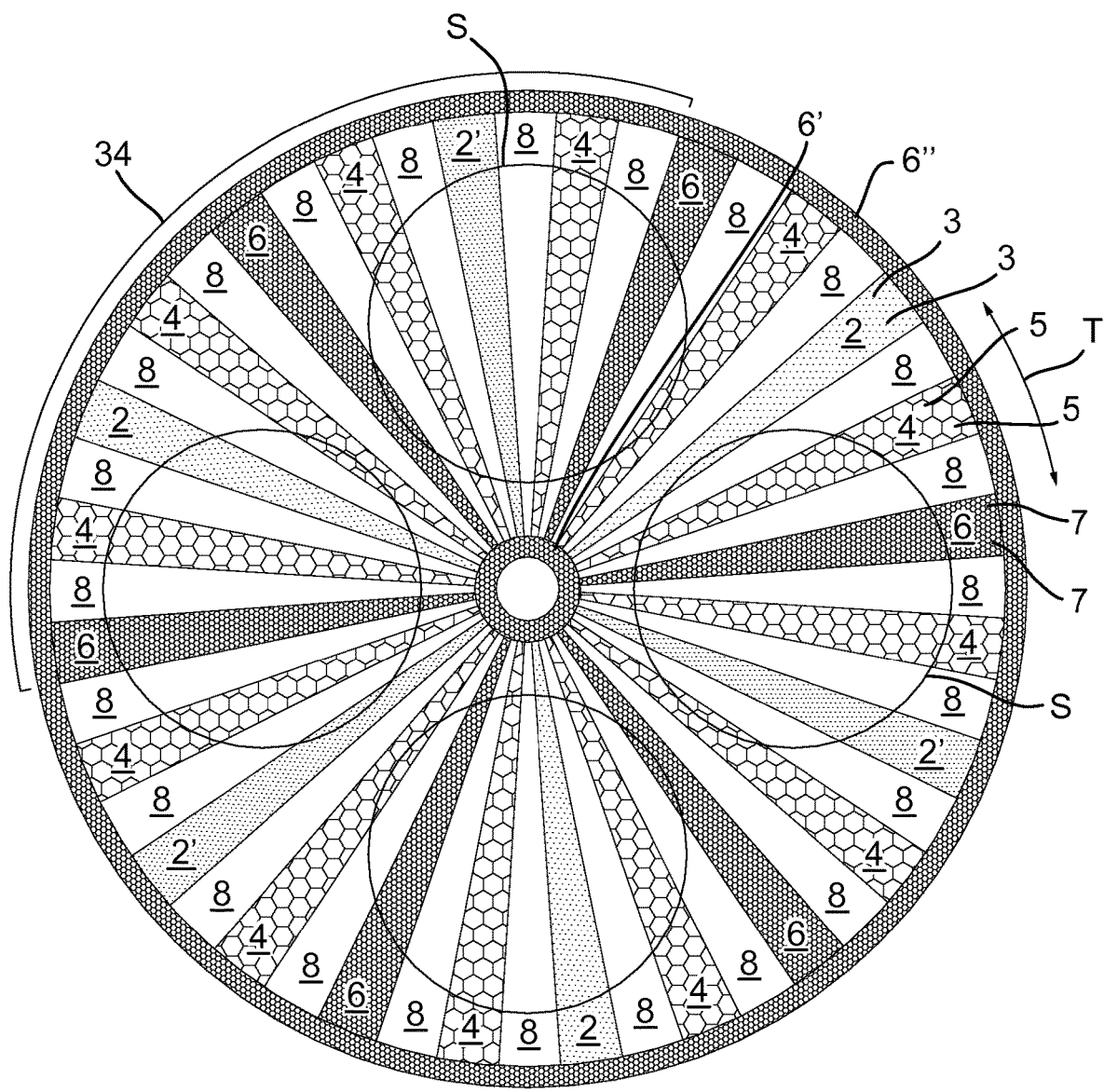
FIG. 8 shows a bottom view of a third example of the deposition head.
Figure 9A:
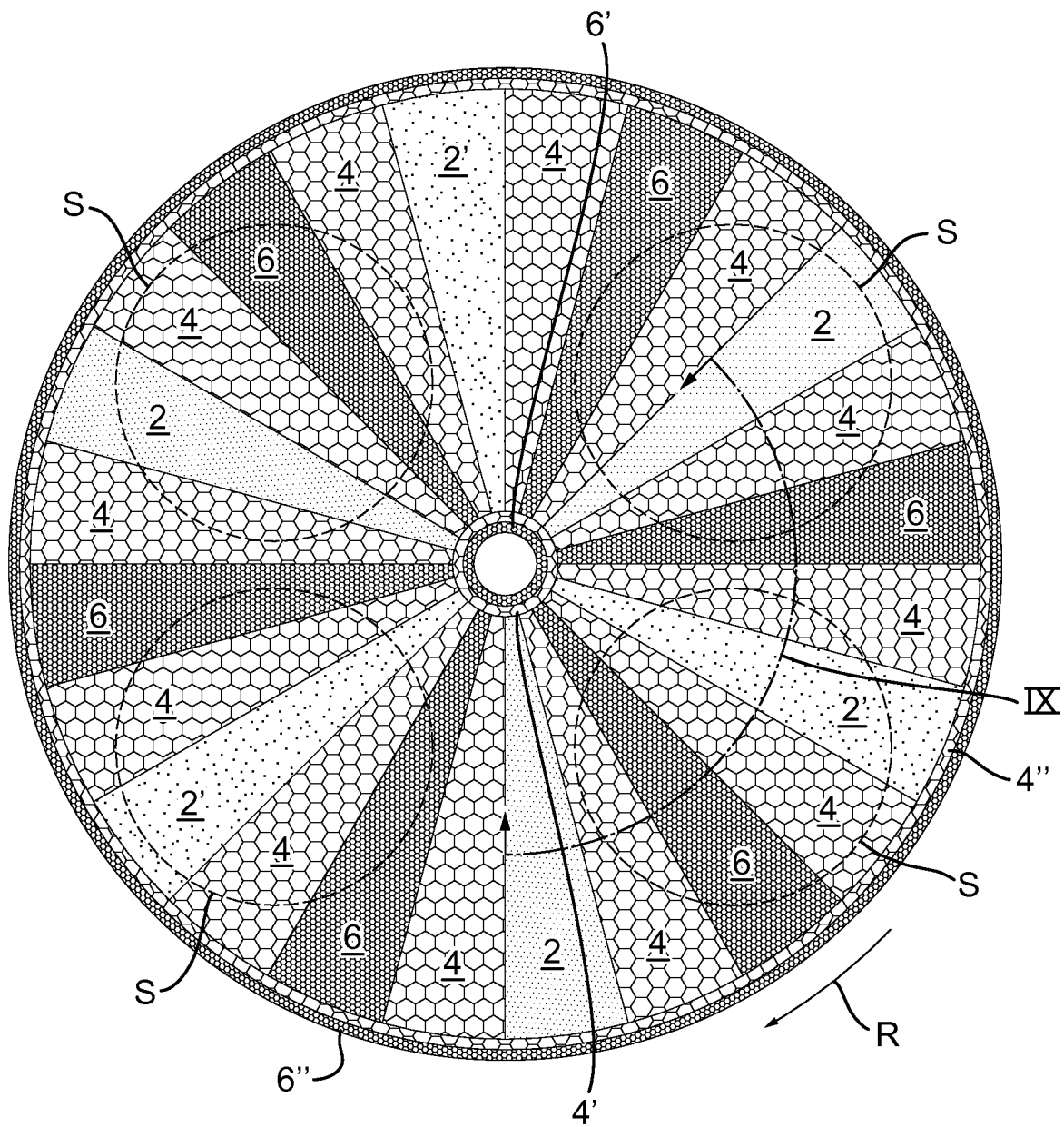
FIG. 9a shows a bottom view of an example deposition head that is similar to example of FIG. 7.
Figure 9B:
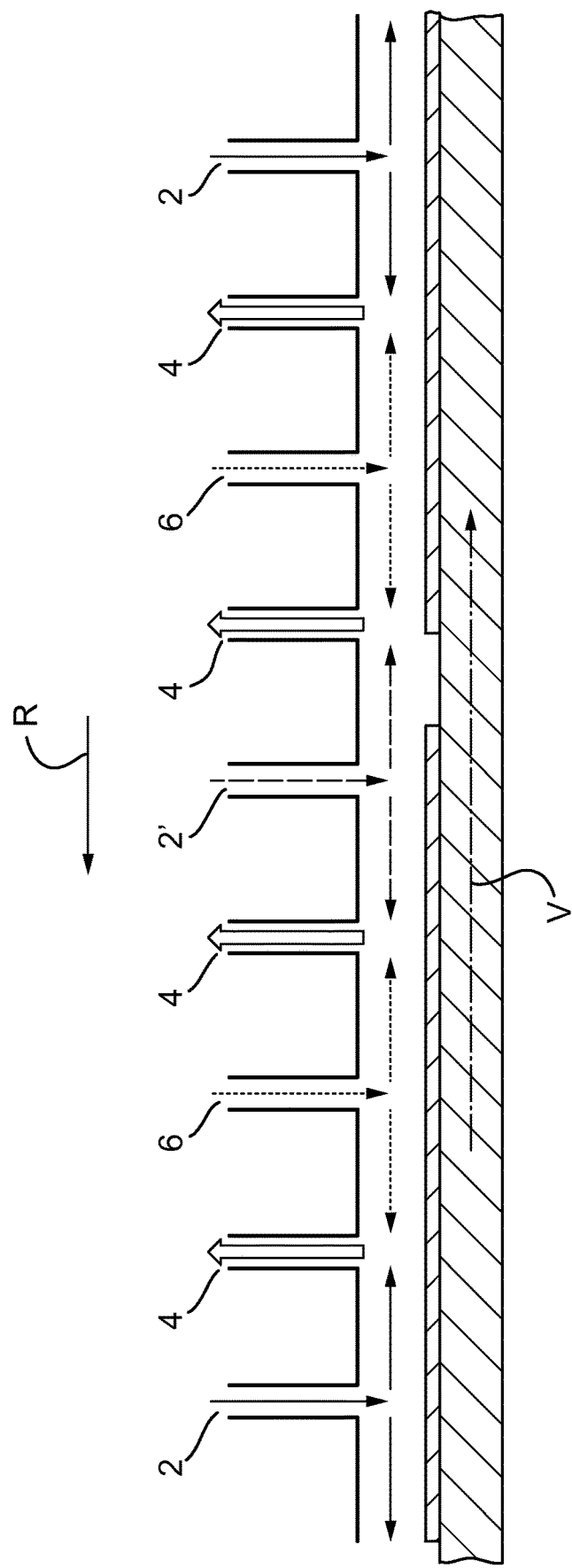

In an embodiment, of which an example is shown in FIG. 8, the ALD-apparatus 1 additionally may comprise separation zones 8, wherein each separation zone 8 is formed by a part of the lower surface 14a that extends in a radial direction relative to the central deposition head axis A1. Each separation zone 8 is free from gas injection openings 3, 7 and gas exhaust openings 5. In this embodiment, between each neighboring pair of zones 2, 2', 4, 6 selected from the group consisting of the purge gas, the first and the second precursor gas and the exhaust zones 2, 2', 4, 6, a said separation zone 8 may extend. An example of this embodiment including separation zones 8 is shown in FIG. 8. Also FIGS. 10a and 10b show an example of an embodiment having a separation zone. As is clear from the examples of FIGS. 6, 7, 9a, 9b, 10a, 10b, 11a and 11b not all neighboring purge, precursor and exhaust zones need be separated by a separation zone 8.

Providing each process section with separation zones 8 may provide additional prevention against the mixing of precursor gases. A separation zone 8 may increase the distance between two different precursor gas zones 2, 2', thus providing more time to deposit elements contained in the precursor gases to the surface of the substrate S. In addition, the tangential distance between first and second precursor gas injection zones 2, 2' may be larger. As such, the separation zones 8 may provide an additional barrier against traversal of a precursor gas supplied in a first precursor gas zone 2 into an adjacent second precursor gas injection zone 2' and vice versa.

In an embodiment, each separation zone 8 may define a separation zone surface part of the lower surface 14a of the deposition head 14 which is at a lower level than the remaining parts of the lower surface 14a that bound the precursor gas injection zones 2, 2', the purge gas injection zones 6 and the gas exhaust zones 4.

The advantage of this embodiment is that the downwardly extending separation zone surface parts of the lower surface 14a may provide a more distinct delimitation of the precursor gas injection zones 2, 2', the purge gas injection zones 6 and the gas exhaust zones 4. This delimitation may also create 'chambers' that have a downwardly directed opening facing the process space 16. As a result, the embodiment may result in the formation of precursor gas injection chambers, purge gas injection chambers and gas exhaust chambers formed in the deposition head 14. Because the gap between upper surface of the susceptor 12 and the lower surface 14a deposition head 14 is larger at the chambers than at the separation zones 8, the distribution of the precursor gas or purge gas within the chambers is promoted. Consequently, the concentration of the gas within a zone bounded by a said chamber may be substantially constant over the entire surface of the zone. Additionally, the chambers may serve to substantially contain the gases injected therein, thereby preventing precursor gases from traversing into adjacent chambers. In addition, the containment of gases may reduce the amount of precursor gas needed during processing as a higher amount of gas may be deposited on the surface of the substrate S before being removed through the gas exhaust zones 4. In order to provide an even further reduction of the precursor gas needed during processing, this embodiment may advantageously be combined with the embodiment that provides an increased distance between the precursor gas injection zones 2, 2' and the gas exhaust zones 4 as disclosed herein.

Figure 2:
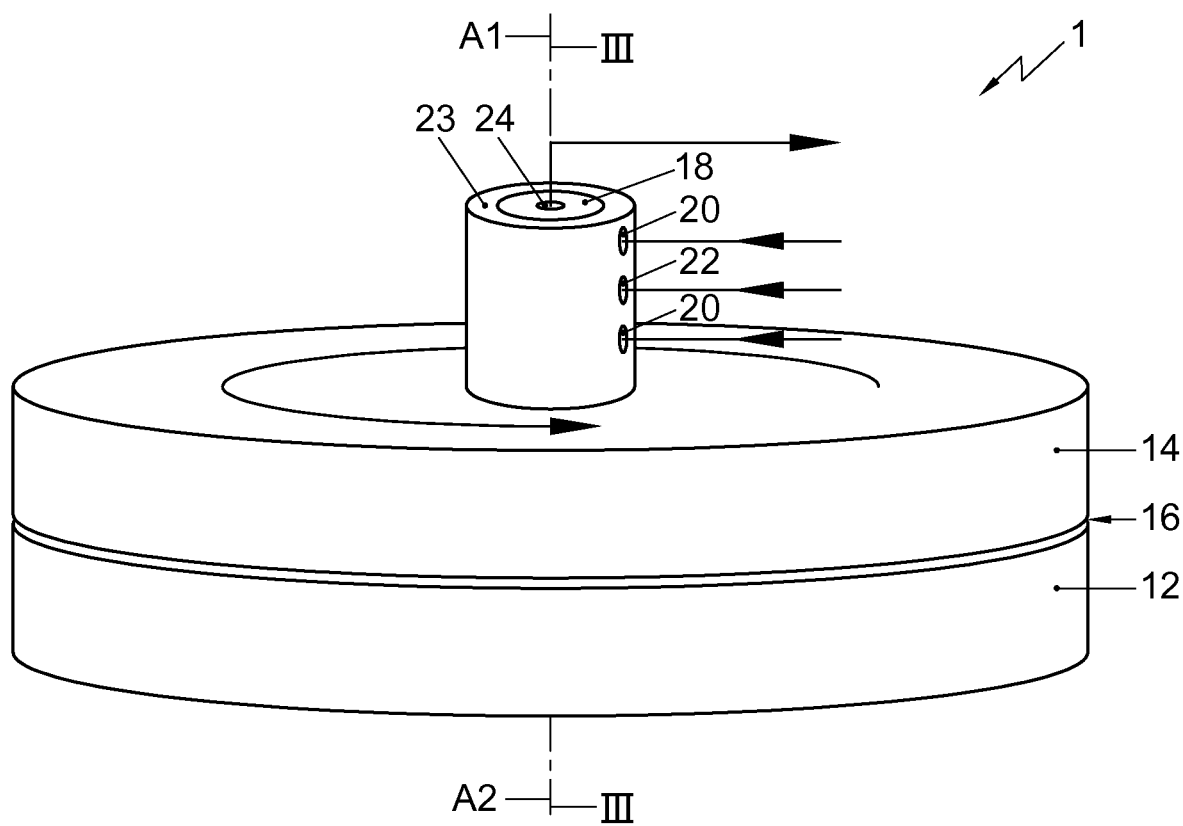
FIG. 2 depicts the ALD apparatus of FIG. 1 in a closed position.
Figure 3:
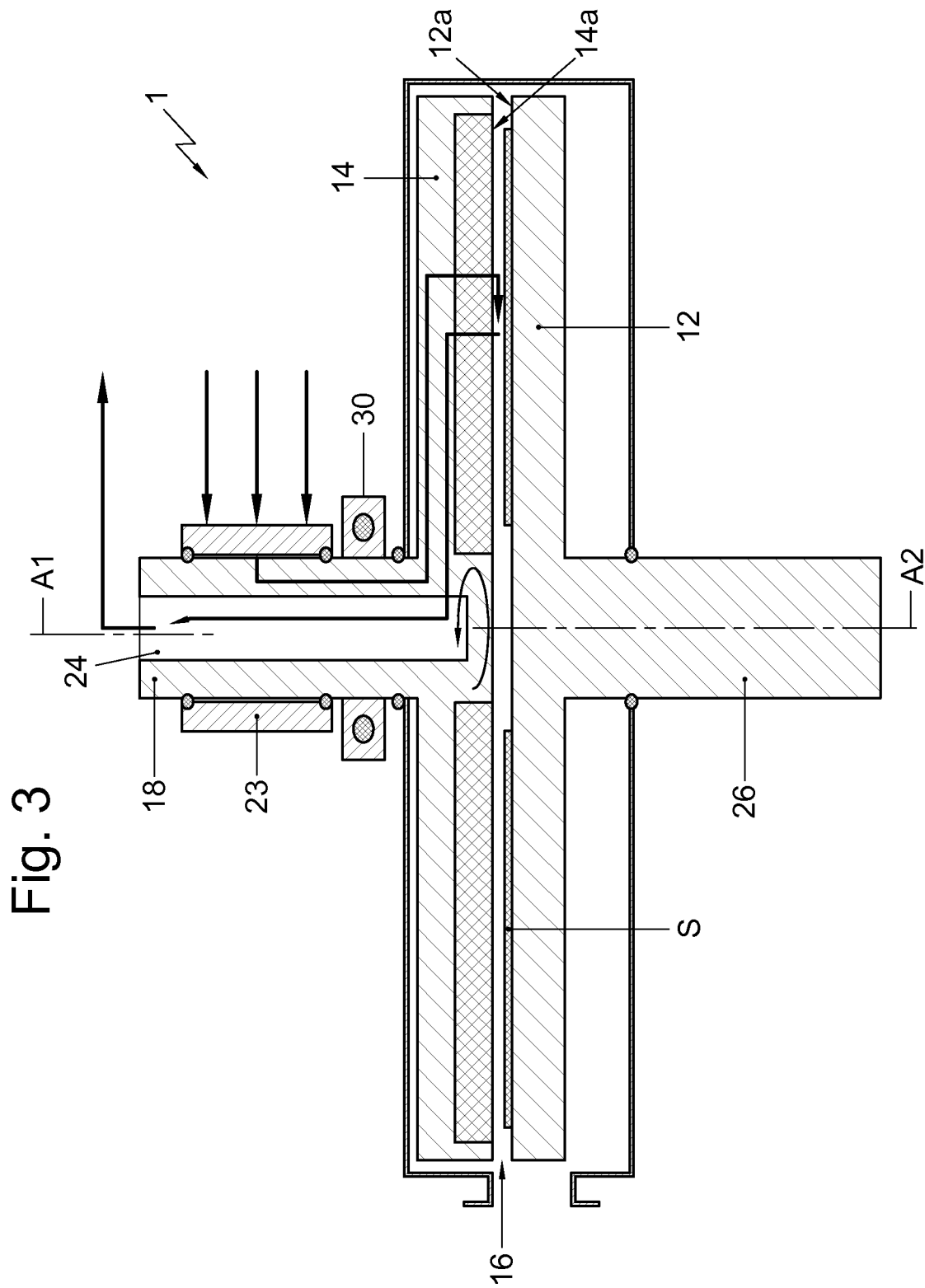
FIG. 3 shows a schematic cross-section along line III-III of in FIG. 1.

In an embodiment, an example of which is provided in FIG. 2, the distance between the lower surface 14a and the upper surface 12a may be in the range of 0.3-7.0 mm, preferably in the range of 0.4-5.0 mm, more preferably in the range of 0.5-2 mm. The distance between the lower surface 14a and the upper surface 12a may be chosen to be in this range to substantially prevent mixing of precursor gases.

The specific distance within this range may be chosen depending on the characteristics of the substrates S, such as thickness or material, but may also be chosen based on the characteristics of the precursor gases used during operation or on the desired film properties. Naturally, the specific distance may be based on a combination of above mentioned characteristics, or on a combination of the above mentioned characteristics with any other relevant characteristics. Preferably, the distance between the lower parts of the lower surface 14a defining the separation zones 8 and the upper surface of the substrate may be chosen in the lower end of the ranges specified above to optimize the containment of the purge gas and the precursor gases within their respective zones 6, 2, 2'.

In an embodiment, the precursor gas injection zones, the purge gas injection zones and/or the gas exhaust zones may be substantially wedge shaped. A radially inner side of the wedge shaped zone substantially extends along a segment of a circle having a center point that coincides with the deposition head axis A1 and having a first radius. A radially outer side of the wedge shaped zone substantially extends along a segment of a circle having a center point that coincides with the deposition head axis (A) and having a second radius which is larger than the first radius. The two other sides of each wedge shaped zone extend in a substantial radial direction relative to the deposition head axis A1 from the radially inner side to the radially outer side of the wedge shape zone.

The rotating deposition head 14 has a circular form with lower surface 14a, in which the precursor gas and purge injection zones 2, 2', 6 and the gas exhaust zones 4 extend radially outward when viewed from the central deposition head axis A1. As a result, the tangential distance between successive zones is relatively small near the central deposition head axis A1. In a radially more outward part of the rotation head 14, the tangential distance between the successive zones may be relatively large. This corresponds with an increasing tangential velocity with increasing radius, and in a constant exposure time over the whole radius. Wedge shaped gas injection zones 2, 2', 6 and gas exhaust zones 4 may be used to provide a substantially equal residence time over the entire surface of the substrate, thus leading to a more uniform deposition of layers.

Figure 14:
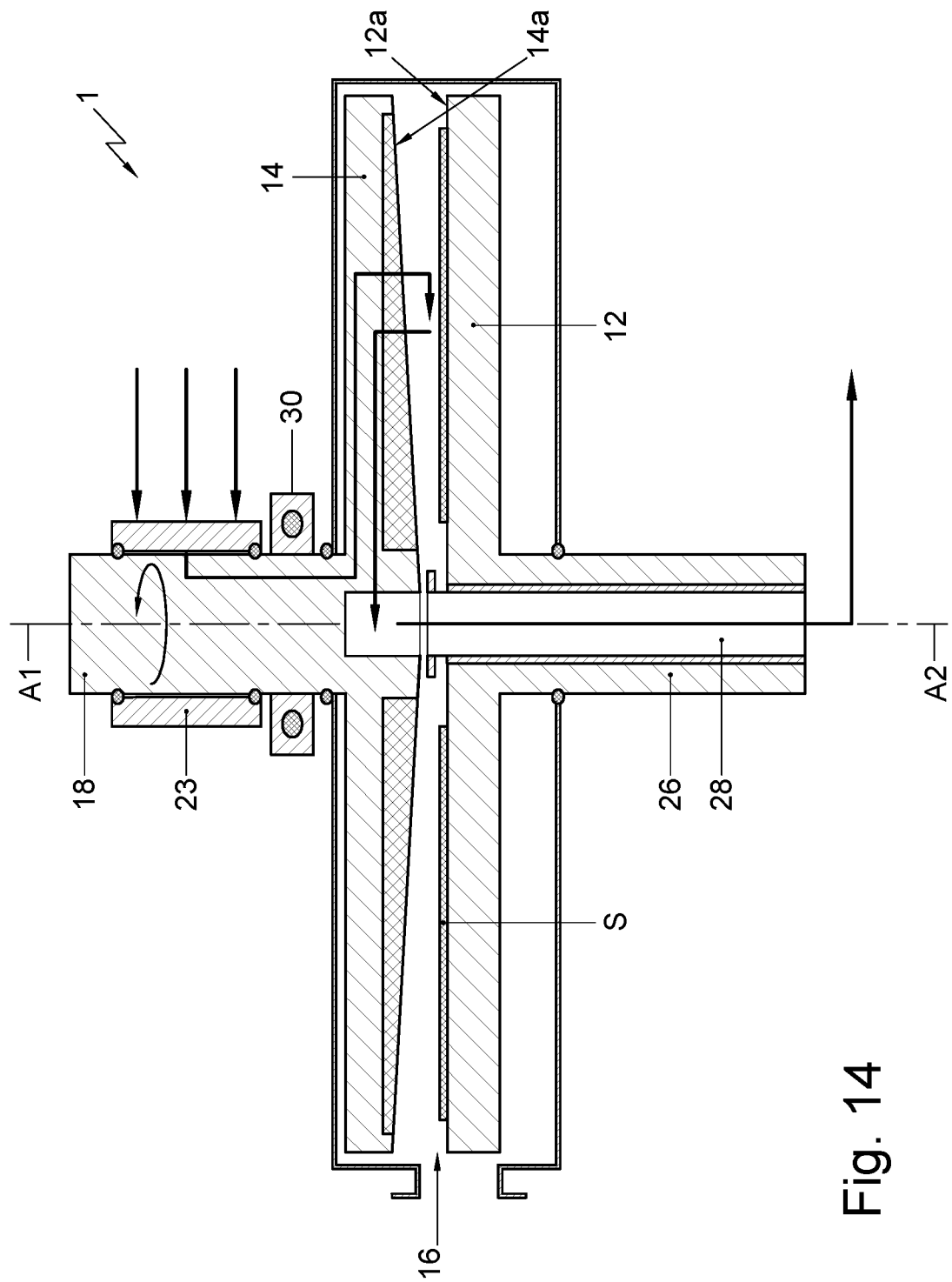
FIG. 14 shows a similar cross section as shown in FIG. 3 from an alternative embodiment of the ALD apparatus in which the lower surface of the deposition head, when viewed from the central deposition head axis in a radially outward direction, is inclined in an upward direction.

In an embodiment, the lower surface 14a of the deposition head 14, when viewed from the central deposition head axis A1 in a radially outward direction, is inclined in an upward direction. The inclination is such that the gap between the lower surface 14a and the upper surface 12a is larger at a larger diameter than at a smaller diameter. An example of this embodiment is shown in FIG. 14.

In an embodiment, the lower surface 14a of the deposition head 14, when viewed from the central deposition head axis A1 in a radially outward direction, is inclined in an upward direction. The inclination is such that the gap between the lower surface 14a and the upper surface 12a is larger at a larger diameter than at a smaller diameter.

The increasing gap height in the radially outward direction may promote a uniform transport of gases between the neighboring zones in tangential direction thereby compensating for the increasing path length with increasing diameter. In an embodiment, the inclination of the lower surface 14a may include an angle with an upwardly extending part of the central deposition head axis A1 between 80° and 90°, and preferably between 85° and 90°.

Figure 11A:
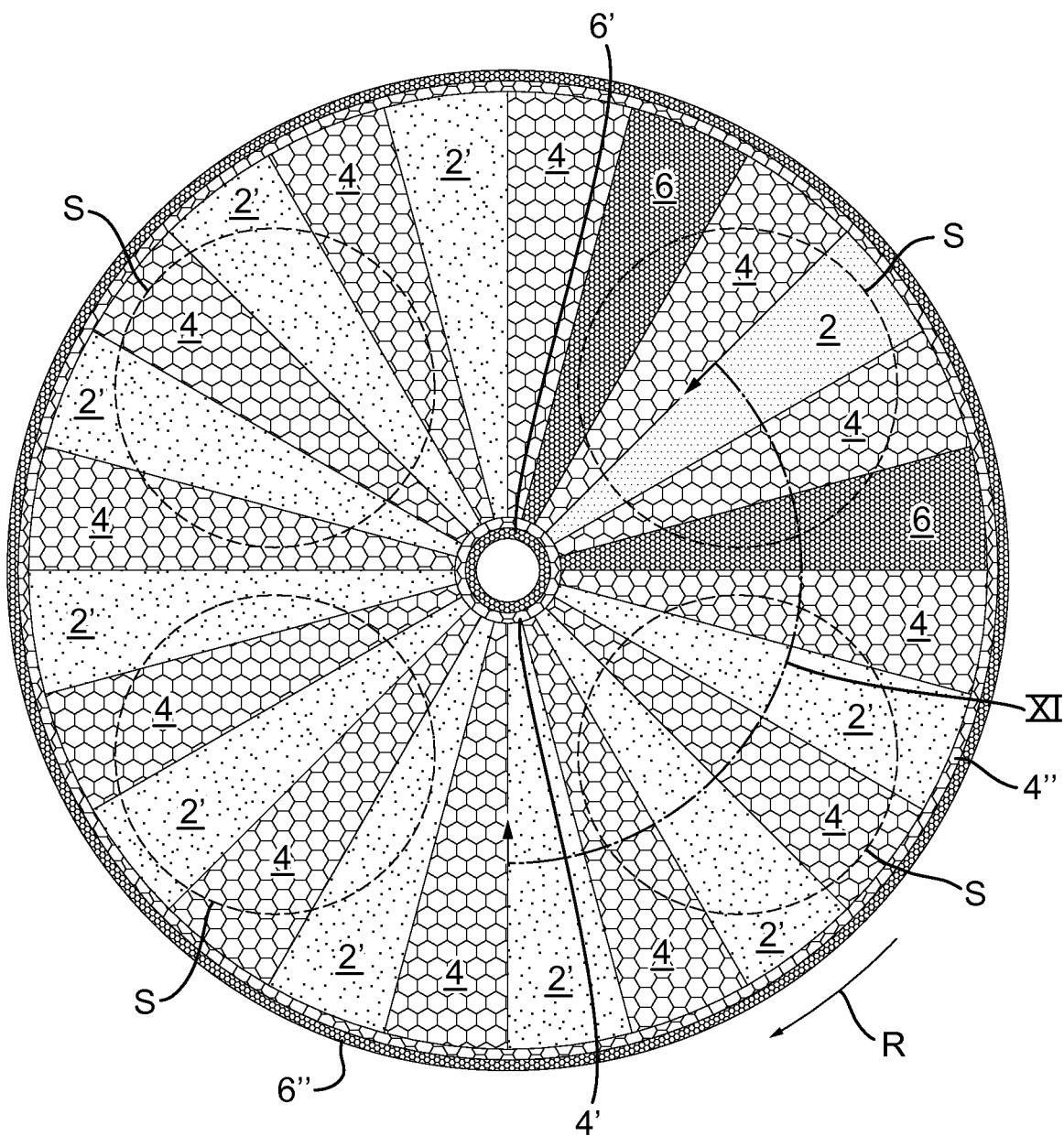
FIG. 11a shows a bottom view of an example of a deposition head having only a single first precursor gas injection zone and a plurality of second precursor gas injection zones.

Yet another embodiment is shown in FIG. 11a. Some precursor gases require longer exposure times than others to achieve complete chemisorption and/or reaction. This can be achieved by increasing the size of the precursor gas injection zone for the precursor that needs the longer exposure time. However, when the zone gets large, say wider than 30 degrees, the gas flow pattern is not very well defined anymore and reaction products can build up in concentration before they are exhausted. In such a situation it is proposed to split up the precursor injection zone into a plurality of injection zones, the plurality of injection zones each injecting the same precursor gas a being separated by exhaust zones. In this way, the reaction products are removed quickly, in each of the injection zones the substrate is exposed to fresh precursor gas and the gas flow pattern is well-defined. Preferably, the angular pitch of adjacent ones of the plurality of injection zones is 60 degrees or less, more preferably 30 degrees or less. The deposition head of FIG. 11a may be provided with separation zones between adjacent precursor injection zones and exhaust zones.

In an embodiment, at least one of the deposition head 14 and the susceptor 12 may be upwardly and downwardly movably mounted along the central deposition head axis A1, such that the distance between the upper surface 12a and the lower surface 14a may be adjustable.

A deposition head 14 and/or a susceptor 12 that may be upwardly and downwardly movable in order to provide an adjustable distance between the upper surface 14a and the lower surface 12a may be used for accommodating a wide range of substrates S to be processed. The upward and downward movability may also be used for increasing the distance between the upper surface 14a and the lower surface 12a to facilitate unloading and loading substrates from and onto the susceptor 12, while maintaining the distance during processing at a lower value.

In an embodiment, the deposition head 14 may comprise a deposition head shaft 18 that is part of the deposition head 14 and that extends upwardly relative to the lower surface 14a and may be coaxial with the central deposition head axis A1. Additionally, the embodiment may include a deposition head shaft sleeve 23 that is coaxial with the deposition head shaft 18. An annular slit 17 may be present between an outer cylindrical surface of the deposition head shaft 18 and an inner cylindrical surface of the deposition head shaft sleeve 23. Between the deposition head shaft 18 and the deposition head shaft sleeve 23 at least two seals 19 may be mounted that are configured to seal off the annular slit 17 in a gastight manner. The seals 19 may be ferro-fluidic seals. An example of this embodiment is shown in FIGS. 1-3 and 5. The deposition head shaft 18 may be provided with at least two precursor gas feed-through channels 20 and a purge gas feed-through channel 22 that may extend at least partially parallel to the central deposition head axis A1. The at least two precursor gas feed-through channels 20 may each be connected to the plurality of precursor gas injection openings 3 of an associated one of the at least one precursor gas injection zone. The gas purge feed-through channel 22 may be connected to the plurality of purge gas injection openings 7.

Figure 5:
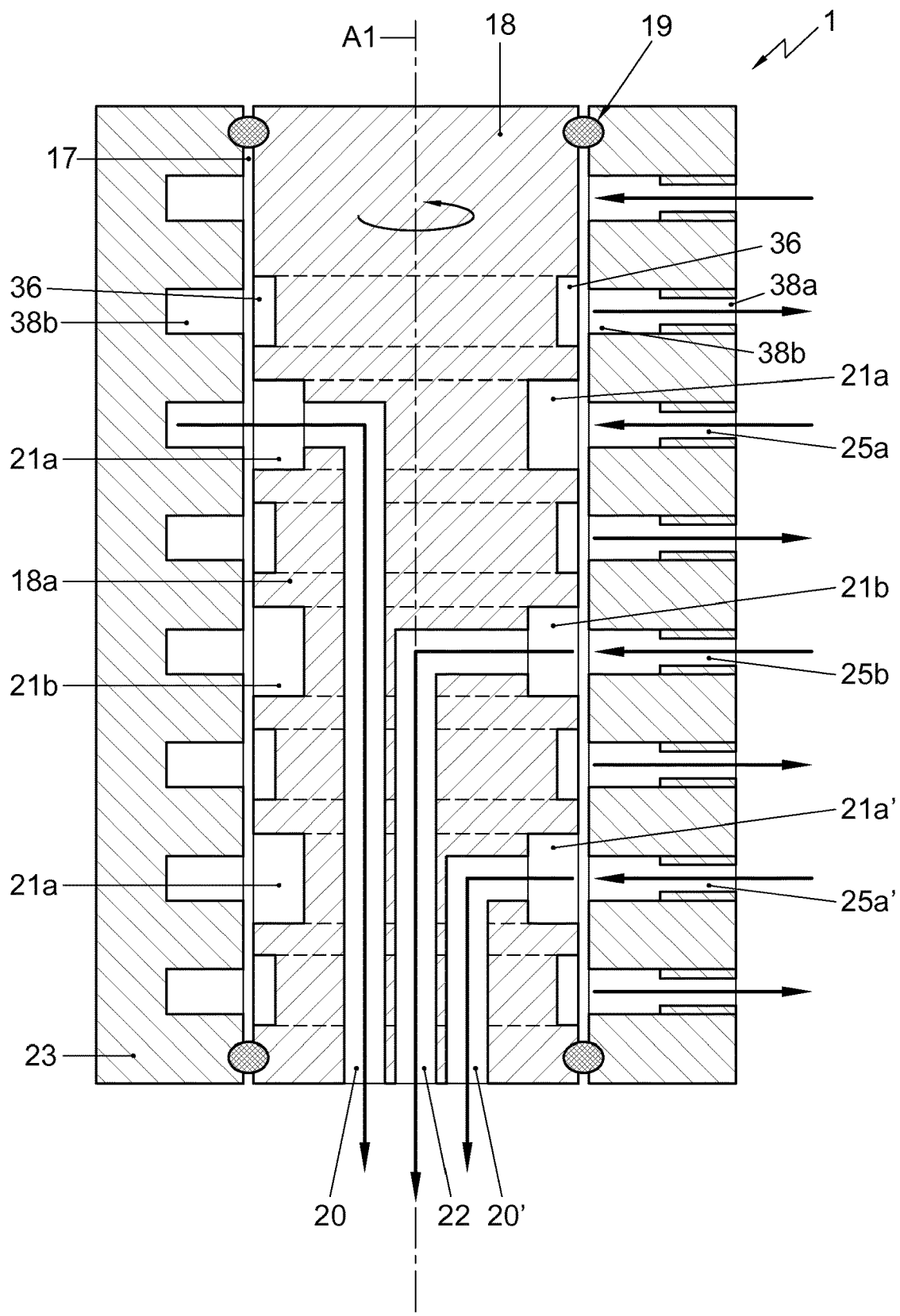
FIG. 5 shows a schematic vertical cross-section of the deposition head shaft.
Figure 6:
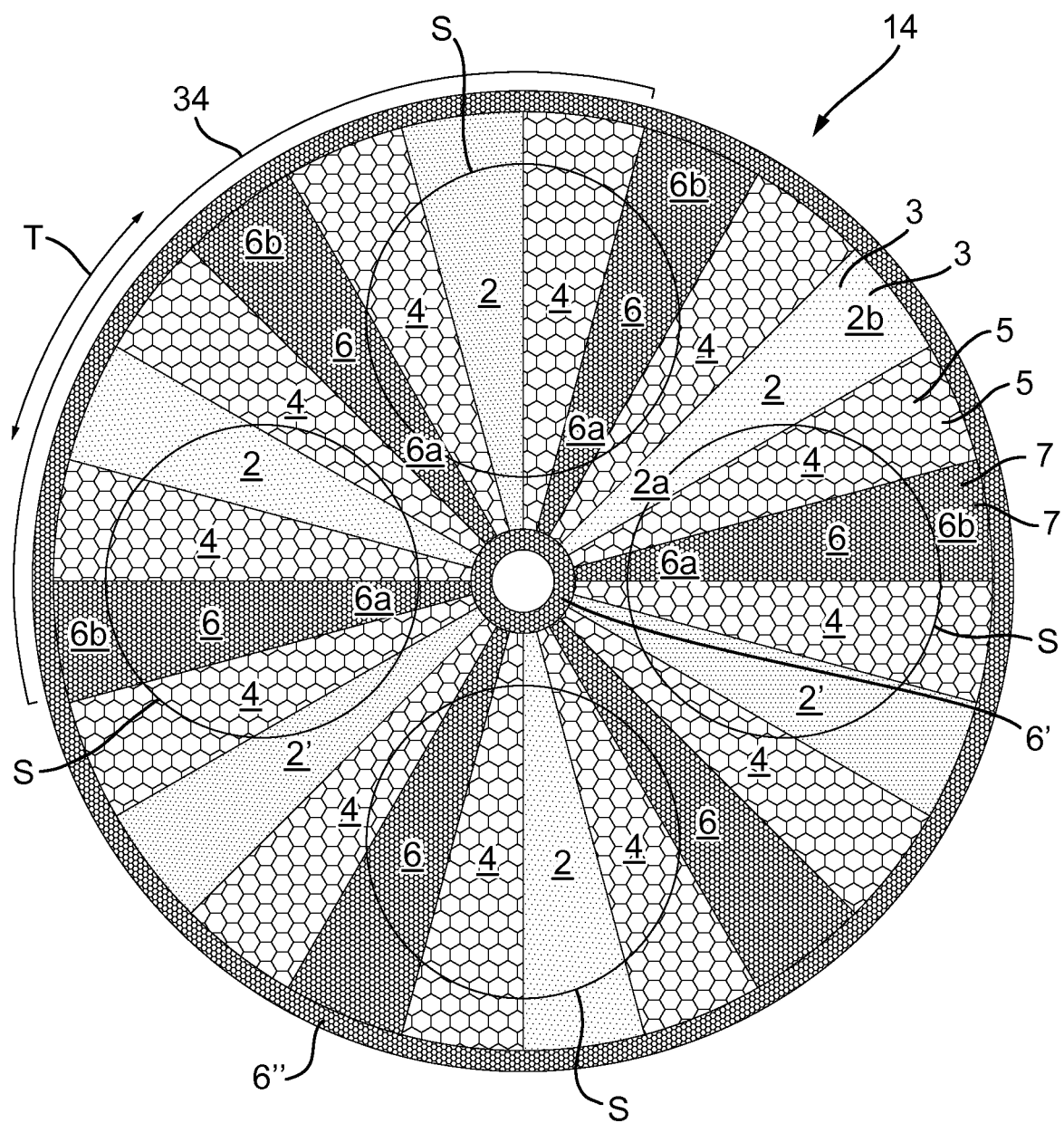
FIG. 6 shows a bottom view of a first example of the deposition head.

The deposition head shaft 18 may serve to mount the deposition head in a bearing 30 and may be coupled with drive means to rotate the deposition head 14. The deposition head shaft 18 is rotatable within the deposition head shaft sleeve 23. In addition, the deposition head shaft 18 may be used to feed precursor and purge gases to the deposition head 14 using for example the at least two precursor gas feed-through channels 20 and a purge gas feed-through channel 22 of which an example is shown in FIG. 5.

The at least two seals 19 between the deposition head shaft 18 and the deposition head sleeve 23 provide a gastight seal of the annular slit while still allowing the deposition head 14 to be rotated. Via the annular slit 17 a reliable connection of gas feeds and gas exhausts to the rotating deposition head 14 is feasible.

The deposition head shaft 18 of this embodiment may include at least two precursor gas feed-through channels 20 and a purge gas feed-through channel 22 that extend at least partially parallel to the central deposition head axis A1. The at least two precursor gas feed-through channels 20 may be each connected to the plurality of precursor gas injection openings 3 of an associated one of the at least one precursor gas injection zone. The gas purge feed-through channel 22 may be connected to the plurality of purge gas injection openings 7. In this embodiment, an outer cylindrical surface of a part of the deposition head shaft 18 that is bounded by the annular slit 17 may comprise at least two annular precursor gas grooves 21a, 21a' in which an upper part of an associated one of the at least two precursor gas feed-through channel 20, 20' terminates. Additionally, said outer cylindrical surface of the deposition head shaft 18 may comprise an annular purge gas groove 21b in which an upper part of the purge gas feed-through channel 22 terminates and that is positioned between the at least two precursor gas grooves 21a. By virtue of this structure, precursor gases and purge gas may continuously be supplied to the precursor gas feed-through channels 20, 20' and the purge gas feed-through channel 22 during operation, i.e. during rotation of deposition head 14.

An outer cylindrical surface of a part of the deposition head shaft 18 that is bounded by the annular slit 17 may comprise at least two precursor gas grooves 21a, 21a' in which an upper part of an associated one of the at least two precursor gas feed-through channels 20, 20' terminate. Additionally, said cylindrical outer surface may include a purge gas groove 21b in which an upper part of the purge gas feed-through channel 22 terminates and that may be positioned between the two precursor gas grooves 21a, 21a'. The deposition head shaft sleeve 23 may comprise at least two precursor gas feed channels 25a, 25a' that are positioned at the same horizontal level as and emanate in an associated one of the at least two precursor gas grooves 21a, 21a', so that, during operation, at least two precursor gases may be supplied to the associated ones of the at least two precursor gas feed-through channels 20, 20'. Additionally, the deposition head shaft sleeve 23 may include a purge gas feed channel 25b that is positioned at the same horizontal level as and emanates in the purge gas groove 21b, so that, during operation, purge gas may be supplied to the purge gas feed-through channel 22. In this embodiment, the two precursor gases are kept separate also within the slit 17 by the purge gas which is supplied to the purge gas groove 21b which is positioned between the two precursor gas grooves 21a, 21a'. Thus undesired mixing of the two precursor gases is prevented even within the slit 17.

The next embodiment, of which an example is shown in FIG. 5, is aimed at further reducing the risk of mixture of precursor gases within the slit 17. To that end, the deposition head shaft sleeve 23 or the deposition head shaft 18 may include at least two annular exhaust grooves 36, 36 of which a first one 36 may be positioned between the purge gas groove 21*b* and a first one 21*a* of the at least two precursor gas grooves 21*a*. A second one 36 of the at least two exhaust grooves may be positioned between the purge gas groove 21*b* and a second one 21*a'* of the at least two precursor gas grooves. The deposition head shaft sleeve 23 includes exhaust gas channels 38*a*, 38*b* that emanate in the annular exhaust grooves 36. In the example shown in FIG. 5, the exhaust gas channels 38*a*, 38*b* in the deposition head shaft sleeve 23 include a radial channel 38*a* that leads to an annular channel 38*b*. The annular exhaust channel 38*b* of the sleeve 23 faces the annular channel 36 in the deposition head shaft 18. Similarly, the precursor gas feed channels 25*a*, 25*a'* and the purge gas feed channel 25*b* in sleeve 23 include a radial portion, and an annular portion, the annular portion facing the grooves 21*a*, 21*a'* and 21*b* respectively in shaft 18.

In an embodiment the deposition head shaft 18 may be provided with at least one gas exhaust channel 24 that may at least partially extend parallel to the central deposition head axis A1. The exhaust channel 24 may be connected to the plurality of gas exhaust openings 5. The exhaust of gas from the plurality of gas exhaust openings 5 may be provided by the gas exhaust channel 24.

Figure 4:
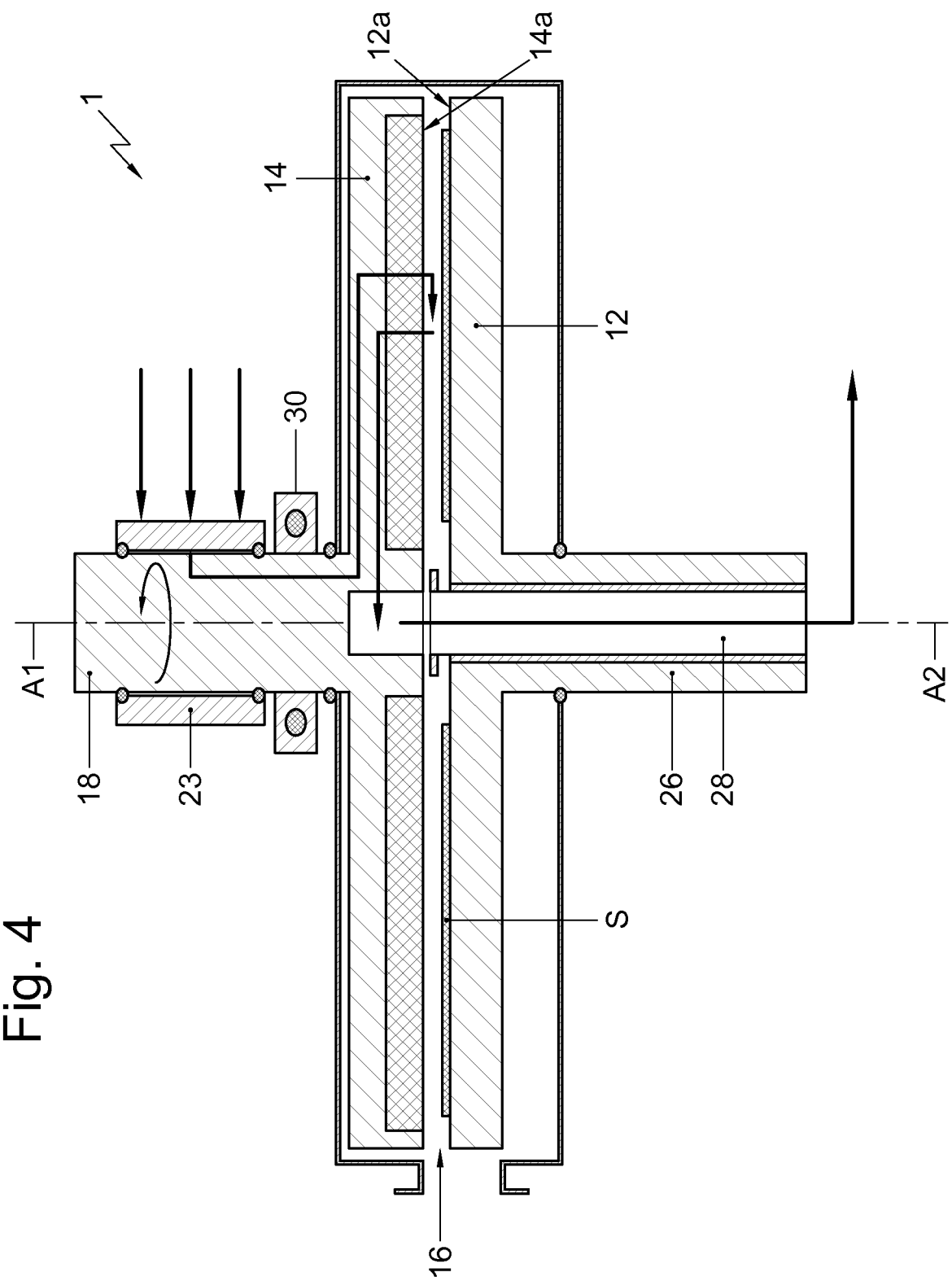
FIG. 4 shows a similar cross section as shown in FIG. 3 from an alternative embodiment of the ALD apparatus.

In an alternative embodiment, of which an example is shown in FIG. 4, the susceptor 12 may comprise a susceptor shaft 26 that may extend downwardly relative the upper surface 12*a* and may be coaxial with the susceptor axis A2. The susceptor shaft 26 and a lower part of the deposition head shaft 18 may be provided with a gas exhaust channel 28 that may extend at least partially parallel to the susceptor axis A2. The gas exhaust channel 28 may be in fluid connection with the plurality of gas exhaust openings 5.

Figure 13:
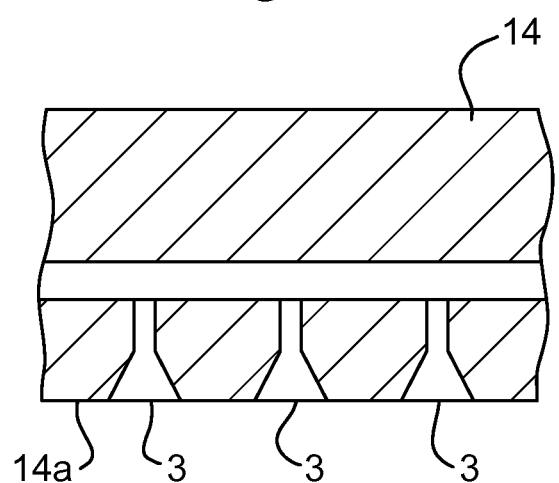
FIG. 13 shows a partial cross sectional view of the deposition head at a precursor gas injection zone in which the end sections of the precursor gas injection channels have a diverging configuration.

In an embodiment, of which an example is shown in FIG. 13, the plurality of precursor gas injection zones 2, 2' may be provided with precursor gas injection channels that have end portions that form the precursor gas injection openings 3 in the lower surface 14*a*. The plurality of purge gas injection zones 6 may be provided with purge gas injection channels that have end portions that form the purge gas injection openings 7 in the lower surface 14*a*. The cross-sectional dimension of the end portion of each precursor gas injection channel and/or of each purge gas injection channel may increase, when viewed in a flow direction within a said channel so that the end portion may diverge.

Such diverging end portions reduce the formation of indentures or 'hole marks' on the surface of the substrate. A diverging end portion may increase the dispersal of the injected gas and consequently reduce the force the injected gas exerts on the surface of the substrate S. As a result, the formation of hole marks in the deposited layers on the surface of the substrate S may be reduced.

Figure 12:
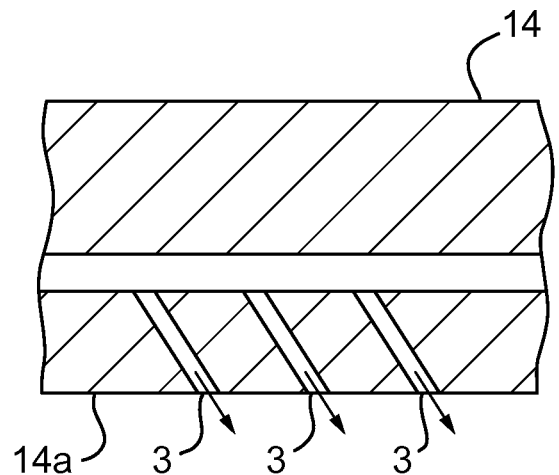
FIG. 12 shows a partial cross sectional view of the deposition head at a precursor gas injection zone in which the end section of the precursor gas injection channels include a sharp angle with the lower surface of the deposition head.

In an embodiment, of which an example is shown in FIG. 12, the plurality of precursor gas injection zones 2, 2' may be provided with precursor gas injection channels that may have end portions that may form the precursor gas injection openings 3 in the lower surface 14*a*. The end portions of the precursor gas injection channels may include a sharp angle with the lower surface 14*a*. The plurality of purge gas injection zones 6 may be provided with purge gas injection channels that may have end portions that may form the purge gas injection openings 7 in the lower surface 14*a*. Also the end portions of the purge gas injection channels may include a sharp angle with the lower surface 14*a*.

When the sharp angle is such that the end portions of the purge gas injection channels and/or the precursor gas injection channels are directed in the direction of rotation of the deposition head 14, the directed outflow may promote a flow in the direction of the Couette flow that exists in the process space 16. The Couette flow is a gas flow that is caused by the rotation of the deposition head which results in a dragging along of gases. When injecting gas under a sharp angle with the lower surface 14*a*, with the angle being directed against the direction of rotation, the magnitude and effect of the Couette flow may be reduced. In addition, the embodiment may also reduce the formation of hole marks on the substrate S as the injected gas is not directed perpendicular to the surface of the substrate S, but includes an angle with said surface 14*a*.

In an embodiment, the susceptor 12 may be rotatable around a susceptor axis that may be co-linear with the central deposition head axis A1. The susceptor 12 may include a susceptor drive for indexing the susceptor 12 around the susceptor axis A2 between subsequent indexing positions.

In an embodiment the upper surface 14 may include a limited number of substrate support positions 32, wherein in each indexing position of the susceptor 12 at least one of said substrate S positions is accessible by a substrate loading assembly.

Providing at least one indexing position that is accessible by a substrate loading assembly may allow semi-continuous automated processing of substrates S in case the distance between upper surface 14*a* and lower surface 12*a* during processing is sufficient to allow loading and unloading of the substrates. The apparatus may automatically load the substrates S on the susceptor 12 and subsequently index the susceptor 12 to the next indexing position to subject the newly loaded substrate S to deposition by the deposition head 14. As a result, an improved production capacity may be obtained because the deposition may be a continuous process that is not interrupted for loading and unloading substrates. In an alternative embodiment, the spacing between susceptor and deposition head may need to be increased relative to the spacing during processing to facilitate loading and unloading of the substrates. The flow of precursor gases may be interrupted. However, there is no need to stop the rotation of the deposition head. The deposition head can continue to rotate at the same speed as during processing or at a lower speed.

In an embodiment a controller for the susceptor drive is configured to keep the susceptor 12 stationary during deposition. Because the susceptor 12 is stationary during deposition and only rotates when indexed to the next position, the chance of the formation of irregularities or other defects on the layers that are deposited is minimized.

In an embodiment, a process section may comprise three different precursor gas injection zones for the injection of three different precursor gases and during processing parts of the substrates are sequentially subjected to the three different precursor gases.

In an embodiment, one or more of the precursor gas injection zones may be provided with electrodes for the generation of an electrical discharge during flowing of the precursor gas in the zone.

In an embodiment the atomic layer deposition apparatus may comprise a first precursor gas source, connected to the first precursor gas injection zones 2, a second precursor gas source, connected to the second precursor gas injection zones 2', a purge gas source, connected to the purge gas injection zones 6, and a vacuum pump, connected to the gas exhaust zones 4.

The gas sources and the vacuum pump may be connected to the plurality of gas injection openings 3, 7 and the plurality of gas exhaust openings 5 by means of the gas feed-through channels and gas exhaust channel respectively.

In an embodiment, the purge gas zones have a purge gas injection zone inner part (6a) and a purge gas injection zone outer part (6b) that is positioned radially outward from the purge gas injection zone inner part (6a). The inner part 6a may be connected to an inner purge gas source and the purge gas injection zone outer part 6b may be connected to an outer purge gas source that is independently controllable from the inner purge gas source with respect to flow rate and/or pressure.

Such an embodiment may be beneficial for a more efficient supply of purge gas in the purge gas zones 6 and allows to balance the flow over the zone.

Alternatively or additionally, at least one of the first and the second precursor gas zones may have a precursor gas injection zone inner part 2a, 2'a and an precursor gas injection zone outer part 2b, 2'b that is positioned radially outward from the precursor gas injection zone inner part. Of each precursor gas injection zone having a inner part (2a, 2'a) and an outer part (2b, 2'b), the inner part (2a, 2'a) may be connected with an inner precursor gas source and the outer part (2b, 2'b) may be connected with a outer precursor gas source. The inner precursor gas source and the outer precursor gas source may supply the same type of precursor gas and may be independently controllable with respect to flow rate and/or pressure.

This embodiment may provide the advantage that the supply of precursor gases within the precursor gas zones may be better controlled so that the formation of the layers at the radially inward regions can be controlled to be substantially similar to the formation of the layers at the radially outward regions.

According to an aspect of the invention, an assembly of an atomic layer deposition apparatus according to the invention and a plurality of substrates that each may have an equal thickness may be provided. The distance between the lower surface 14a of the deposition head 14 and an upper surface of each substrate that is positioned on the susceptor 12 may be in the range of 0.3-7.0 mm, preferably 0.4-5.0 mm and more preferably 0.5-2 mm.

Especially when the distance is in the lower end of the ranges mentioned, the chance that two different precursor gases mix within the process space 16 is minimized.

While specific embodiments have been described above, it will be appreciated that all features described herein about the deposition head, in particular those relating to the precursor gas and purge gas injection zones, the exhaust zones and the separation zones may also beneficially be applied to an ALD apparatus having only a susceptor that is rotatable and a deposition head that is non-rotatable. Further, it will be appreciated that the invention may be practiced otherwise than as described. The descriptions above are intended to be illustrative, not limiting. Thus, it will be apparent to one skilled in the art that modifications may be made to the invention as described in the foregoing without departing from the scope of the claims set out below. Various embodiments may be applied in combination or may be applied independently from one another. Reference numbers used in the above detailed description are not intended to limit the description of the embodiments to the examples shown in the figures. The figures just represent examples and the embodiments may be embodied in other ways than specific way shown in the examples of the drawings.

LEGENDA

1—Atomic layer apparatus
2—first precursor gas injection zone
2'—second precursor gas injection zone
2a—precursor gas injection zone inner part
2b—precursor gas injection zone outer part
3—precursor gas injection opening
4—gas exhaust zone
5—gas exhaust opening
6—purge gas injection zone
6a—purge gas injection zone inner part
6b—purge gas injection zone outer part
7—purge gas injection opening
8—separation zone
12—susceptor
12a—susceptor upper surface
14—deposition head
14a—deposition head lower surface
16—process space
17—circumferential slit
18—deposition head shaft
19—seal
20, 20'—precursor gas feed-through channels
21—annular grooves
21a, 2a'—precursor gas grooves
21b—purge gas groove
22—purge gas feed-through channel
23—deposition head shaft sleeve
24—gas exhaust channel in deposition head shaft
25a, 25a'—precursor gas feed channels
25b—purge gas feed channel
26—susceptor shaft
28—gas exhaust channel in susceptor shaft
30—bearing
32—substrate support positions
34—process section
36—annular exhaust grooves in the deposition head shaft
38a—radially extending exhaust channel in the shaft sleeve
38b—annular exhaust groove in the shaft sleeve
S—substrates
A1—central deposition head axis
A2—susceptor axis
T—tangential direction
V—direction of movement of substrate relative to deposition head
R—rotational direction of deposition head

The invention claimed is:

1. An atomic layer deposition apparatus, comprising:
a susceptor having an upper surface configured for supporting a plurality of substrates;
a deposition head shaft defining a central deposition head axis extending perpendicular relative to the upper surface and rotatable within a deposition head shaft sleeve, the deposition head shaft sleeve coaxial with the deposition head shaft;
wherein an outer cylindrical surface of the deposition head shaft and an inner cylindrical surface of the deposition head shaft sleeve define an annular slit and wherein between the deposition head shaft and the deposition head shaft sleeve at least two seals are mounted that are configured to seal the annular slit in a gastight manner;

a deposition head mounted to the deposition head shaft, disposed above the susceptor and having a lower surface positioned opposite the upper surface of the susceptor and having substantially the same dimensions as the upper surface, wherein a gap between the upper surface and the lower surface defines an open process space for accommodating substrates to be processed, wherein the lower surface includes:
 a plurality of precursor gas injection openings configured to inject precursor gas into the process space for forming a plurality of precursor gas injection zones in the gap defining the process space;
 a plurality of gas exhaust openings configured to exhaust gas from the process space for forming a plurality of gas exhaust zones in the gap defining the process space;
 a plurality of purge gas injection openings configured to inject purge gas into the process space for forming a plurality of purge gas injection zones in the gap defining the process space;
wherein the deposition head shaft includes at least two feed-through channels that extend at least partially parallel to the central deposition head axis;
wherein the outer cylindrical surface of the deposition head shaft includes at least two annular gas grooves in which an upper part of an associated one of the at least two feed-through channels terminate, and wherein the annular slit extends between the at least two annular gas grooves;
wherein the inner cylindrical surface of the deposition head shaft sleeve includes at least two precursor gas channels that are positioned at the same horizontal level as and emanate from an associated one of the at least two precursor gas grooves;
wherein the deposition head shaft is configured to mount the deposition head in a bearing and configure to rotate the deposition head around the central deposition head axis;
wherein the precursor gas injection zones, the gas exhaust zones and the purge gas zones extend in the gap defining the process space in a radial direction relative to the central deposition head axis;
wherein the plurality of precursor gas injection openings, the plurality of gas exhaust openings, and the plurality of purge gas injection openings in the lower surface form within the gap at least one process section which each includes, when viewed along a tangential direction relative to the central deposition head axis, a purge gas injection zone, a first precursor gas injection zone, a gas exhaust zone, a purge gas injection zone, a second precursor gas injection zone and a gas exhaust zone; and
wherein in use, during rotation of the deposition head relative to the susceptor and during injection of the first and the second precursor gases and the purge gas, the combination of distance between the lower surface and the upper surface, the rotational speed of the deposition head and the flow rate and the pressure of the purge gas flows are selected such that the first and second precursor gases are substantially prevented from mixing.

2. The atomic layer deposition apparatus according to claim 1, wherein the lower surface of the deposition head comprises:
 a first annular purge zone that extends around the central axis in an area radially inward from the radially extending precursor gas injection zones, exhaust gas zones and purge gas zones;
 a second annular purge zone that extends around the central axis in an area radially outward from the radially extending precursor gas injection zones, exhaust gas zones and purge gas zones.

3. The atomic layer deposition apparatus according to claim 2, wherein:
 at a given radius, the tangential distance between a precursor gas injection zone and an adjacent gas exhaust zone is larger than the tangential distance between a purge gas injection zone and an adjacent gas exhaust zone at said given radius;
 a first purge gas injection zone, the first precursor gas injection zone, a first gas exhaust zone, a second purge gas injection zone, the second precursor gas injection zone and a second gas exhaust zone are successively arranged in each process section without the interposition of any additional gas injection zone and gas exhaust zone;
 each of the process sections includes:
  an additional first gas exhaust zone that, when viewed along a tangential direction relative to the central deposition head axis, is positioned between the first purge gas zone and the successive first precursor gas zone; and/or
  an additional second gas exhaust zone that, when viewed along a tangential direction relative to the central deposition head axis, is positioned between the second purge gas zone and the successive second precursor gas zone;
 at a given radius, a tangential distance between the second precursor gas injection zone and an adjacent gas exhaust zone is substantially equal to the tangential distance between a purge gas injection zone and an adjacent gas exhaust zone at said given radius;
 additionally comprising separation zones, wherein each separation zone is formed by a part of the lower surface that extends in a radial direction relative to the central deposition head axis, wherein each separation zone is free from gas injection openings and gas exhaust openings, wherein between each neighboring pair of zones selected from the group consisting of the purge gas, the first and the second precursor gas and the exhaust zones, a said separation zone extends;
 each separation zone defines a separation zone surface part of the lower surface of the deposition head which is at a lower level than the parts of the lower surface that bound the precursor gas injection zones, the purge gas injection zones and the gas exhaust zones;
 the distance between the lower surface and the upper surface is in the range of 0.3-7.0 mm and preferably in the range of 0.4-5.0 mm and more preferably in the range of 0.5-2.0 mm;
 the precursor gas injection zones, the purge gas injection zones and/or the gas exhaust zones are substantially wedge shaped, wherein a radially inner side of the wedge shaped zone substantially extends along a segment of a circle having a center point that coincides with the central deposition head axis and having a first radius, wherein a radially outer side of the wedge shaped zone substantially extends along a segment of a circle having a center point that coincides with the central deposition head axis and having a second radius which is larger than the first radius, wherein two other sides of each wedge shaped zone extend substantially in a radial direction relative to the central deposition head axis from the radially inner side to the radially outer side of the wedge shape zone;

the lower surface of the deposition head, when viewed from the central deposition head axis in a radially outward direction, is inclined in an upward direction, such that the gap between the lower surface and the upper surface is larger at a larger diameter than at a smaller diameter;

the inclination includes an angle with an upwardly extending part of the central deposition head axis between 80° and 90°, and preferably between 85° and 90°; and at least one of the deposition head and the susceptor is upwardly and downwardly movably mounted along the central deposition head axis, such that the distance between the upper surface and the lower surface is adjustable.

4. The atomic layer deposition apparatus according to claim 3, wherein:

the plurality of precursor gas injection zones is provided with precursor gas injection channels that have end portions that form the precursor gas injection openings in the lower surface, wherein the plurality of purge gas injection zones is provided with purge gas injection channels that have end portions that form the purge gas injection openings in the lower surface, wherein the cross-sectional dimension of the end portion of each precursor gas injection channel and/or of each purge gas injection channel increases, when viewed in a flow direction within a said channel so that the end portion diverges;

the plurality of precursor gas injection zones is provided with precursor gas injection channels that have end portions that form the precursor gas injection openings in the lower surface, wherein the end portions of the precursor gas injection channels include a sharp angle with the lower surface, and wherein the plurality of purge gas injection zones is provided with purge gas injection channels that have end portions that form the purge gas injection openings in the lower surface, wherein the end portions of the purge gas injection channels include a sharp angle with the lower surface;

the susceptor is rotatable around a susceptor axis that is collinear with the central deposition head axis, the susceptor including a susceptor drive for indexing the susceptor around the susceptor axis between subsequent indexing positions;

the upper surface includes a limited number of substrate support positions, wherein in each indexing position of the susceptor at least one of said substrate positions is accessible by a substrate loading assembly;

a controller for the susceptor drive is configured to keep the susceptor stationary during deposition;

comprising:

a precursor gas source of a first precursor gas, fluidly connected to a first subset of the plurality of precursor gas injection openings for forming the first precursor gas injection zones;

a precursor gas source of a second precursor gas, fluidly connected to a second subset of the plurality of precursor gas injection openings for forming the second precursor gas injection zones;

a purge gas source, fluidly connected to the plurality of purge gas injection openings for forming the purge gas injection zones;

a vacuum pump, fluidly connected to the plurality of gas exhaust openings for forming the gas exhaust zones;

wherein the purge gas zones have a purge gas injection zone inner part and a purge gas injection zone outer part that is positioned radially outward from the purge gas injection zone inner part, wherein the purge gas injection zone inner part is connected to an inner purge gas source and the purge gas injection zone outer part is connected to an outer purge gas source that is independently controllable from the inner purge gas source with respect to flow rate and/or pressure; and/or wherein at least one of the first and the second precursor gas zones have a precursor gas injection zone inner part and an precursor gas injection zone outer part that is positioned radially outward from the precursor gas injection zone inner part, wherein of each precursor gas injection zone having an inner part and an outer part the inner part is connected with an inner precursor gas source and the outer part is connected with an outer precursor gas source, wherein the inner precursor gas source and the outer precursor gas source supply the same type of precursor gas and are independently controllable with respect to flow rate and/or pressure; and a plurality of substrates that each have an equal thickness, wherein a distance between the lower surface of the deposition head and an upper surface of each substrate that is positioned on the susceptor is in the range of 0.3-7.0 mm, preferably 0.4-5.0 mm and more preferably in the range of 0.5-2.0.

5. The atomic layer deposition apparatus according to claim 1, wherein the deposition head comprises a plurality of process sections that are, when viewed in said tangential direction, positioned successively in the lower surface.

6. The atomic layer deposition apparatus according to claim 5, wherein:

at a given radius, the tangential distance between a precursor gas injection zone and an adjacent gas exhaust zone is larger than the tangential distance between a purge gas injection zone and an adjacent gas exhaust zone at said given radius;

a first purge gas injection zone, the first precursor gas injection zone, a first gas exhaust zone, a second purge gas injection zone, the second precursor gas injection zone and a second gas exhaust zone are successively arranged in each process section without the interposition of any additional gas injection zone and gas exhaust zone;

each of the process sections includes:

an additional first gas exhaust zone that, when viewed along a tangential direction relative to the central deposition head axis, is positioned between the first purge gas zone and the successive first precursor gas zone; and/or an additional second gas exhaust zone that, when viewed along a tangential direction relative to the central deposition head axis, is positioned between the second purge gas zone and the successive second precursor gas zone;

at a given radius, a tangential distance between the second precursor gas injection zone and an adjacent gas exhaust zone is substantially equal to the tangential distance between a purge gas injection zone and an adjacent gas exhaust zone at said given radius;

additionally comprising separation zones, wherein each separation zone is formed by a part of the lower surface that extends in a radial direction relative to the central deposition head axis, wherein each separation zone is free from gas injection openings and gas exhaust openings, wherein between each neighboring pair of zones selected from the group consisting of the purge gas, the first and the second precursor gas and the exhaust zones, a said separation zone extends;

each separation zone defines a separation zone surface part of the lower surface of the deposition head which is at a lower level than the parts of the lower surface that bound the precursor gas injection zones, the purge gas injection zones and the gas exhaust zones;

the distance between the lower surface and the upper surface is in the range of 0.3-7.0 mm and preferably in the range of 0.4-5.0 mm and more preferably in the range of 0.5-2.0 mm;

the precursor gas injection zones, the purge gas injection zones and/or the gas exhaust zones are substantially wedge shaped, wherein a radially inner side of the wedge shaped zone substantially extends along a segment of a circle having a center point that coincides with the central deposition head axis and having a first radius, wherein a radially outer side of the wedge shaped zone substantially extends along a segment of a circle having a center point that coincides with the central deposition head axis and having a second radius which is larger than the first radius, wherein two other sides of each wedge shaped zone extend substantially in a radial direction relative to the central deposition head axis from the radially inner side to the radially outer side of the wedge shape zone;

the lower surface of the deposition head, when viewed from the central deposition head axis in a radially outward direction, is inclined in an upward direction, such that the gap between the lower surface and the upper surface is larger at a larger diameter than at a smaller diameter;

the inclination includes an angle with an upwardly extending part of the central deposition head axis between 80° and 90°, and preferably between 85° and 90°; and at least one of the deposition head and the susceptor is upwardly and downwardly movably mounted along the central deposition head axis, such that the distance between the upper surface and the lower surface is adjustable.

7. The atomic layer deposition apparatus according to claim 6, wherein:

the plurality of precursor gas injection zones is provided with precursor gas injection channels that have end portions that form the precursor gas injection openings in the lower surface, wherein the plurality of purge gas injection zones is provided with purge gas injection channels that have end portions that form the purge gas injection openings in the lower surface, wherein the cross-sectional dimension of the end portion of each precursor gas injection channel and/or of each purge gas injection channel increases, when viewed in a flow direction within a said channel so that the end portion diverges;

the plurality of precursor gas injection zones is provided with precursor gas injection channels that have end portions that form the precursor gas injection openings in the lower surface, wherein the end portions of the precursor gas injection channels include a sharp angle with the lower surface, and wherein the plurality of purge gas injection zones is provided with purge gas injection channels that have end portions that form the purge gas injection openings in the lower surface, wherein the end portions of the purge gas injection channels include a sharp angle with the lower surface;

the susceptor is rotatable around a susceptor axis that is collinear with the central deposition head axis, the susceptor including a susceptor drive for indexing the susceptor around the susceptor axis between subsequent indexing positions;

the upper surface includes a limited number of substrate support positions, wherein in each indexing position of the susceptor at least one of said substrate positions is accessible by a substrate loading assembly;

a controller for the susceptor drive is configured to keep the susceptor stationary during deposition;

comprising:

a precursor gas source of a first precursor gas, fluidly connected to a first subset of the plurality of precursor gas injection openings for forming the first precursor gas injection zones;

a precursor gas source of a second precursor gas, fluidly connected to a second subset of the plurality of precursor gas injection openings for forming the second precursor gas injection zones;

a purge gas source, fluidly connected to the plurality of purge gas injection openings for forming the purge gas injection zones;

a vacuum pump, fluidly connected to the plurality of gas exhaust openings for forming the gas exhaust zones;

wherein the purge gas zones have a purge gas injection zone inner part and a purge gas injection zone outer part that is positioned radially outward from the purge gas injection zone inner part, wherein the purge gas injection zone inner part is connected to an inner purge gas source and the purge gas injection zone outer part is connected to an outer purge gas source that is independently controllable from the inner purge gas source with respect to flow rate and/or pressure; and/or wherein at least one of the first and the second precursor gas zones have a precursor gas injection zone inner part and an precursor gas injection zone outer part that is positioned radially outward from the precursor gas injection zone inner part, wherein of each precursor gas injection zone having an inner part and an outer part the inner part is connected with an inner precursor gas source and the outer part is connected with an outer precursor gas source, wherein the inner precursor gas source and the outer precursor gas source supply the same type of precursor gas and are independently controllable with respect to flow rate and/or pressure; and a plurality of substrates that each have an equal thickness, wherein a distance between the lower surface of the deposition head and an upper surface of each substrate that is positioned on the susceptor is in the range of 0.3-7.0 mm, preferably 0.4-5.0 mm and more preferably in the range of 0.5-2.0.

8. The atomic layer deposition apparatus according to claim 1, wherein, at a given radius, the tangential distance between a precursor gas injection zone and an adjacent gas exhaust zone is larger than the tangential distance between a purge gas injection zone and an adjacent gas exhaust zone at said given radius.

9. The atomic layer deposition apparatus according to claim 1, wherein the purge gas injection zone, the first precursor gas injection zone, the gas exhaust zone, the purge gas injection zone, the second precursor gas injection zone and a gas exhaust zone are successively arranged in each process section without the interposition of any additional gas injection zone and gas exhaust zone.

10. The atomic layer deposition apparatus according to claim 1, wherein each of the process sections includes:
an additional first gas exhaust zone that, when viewed along a tangential direction relative to the central deposition head axis, is positioned between the first purge gas zone and the successive first precursor gas zone; and/or
an additional second gas exhaust zone that, when viewed along a tangential direction relative to the central deposition head axis, is positioned between the second purge gas zone and the successive second precursor gas zone.

11. The atomic layer deposition apparatus according to claim 10, wherein, at a given radius, a tangential distance between the second precursor gas injection zone and an adjacent gas exhaust zone is substantially equal to the tangential distance between a purge gas injection zone and an adjacent gas exhaust zone at said given radius.

12. The atomic layer deposition apparatus according to claim 1, additionally comprising separation zones, wherein each separation zone is formed by a part of the lower surface that extends in a radial direction relative to the central deposition head axis, wherein each separation zone is free from gas injection openings and gas exhaust openings, wherein between each neighboring pair of zones selected from the group consisting of the purge gas zones, the first and the second precursor gas zones and the exhaust zones, a said separation zone extends.

13. The atomic layer deposition apparatus according to claim 12, wherein each separation zone defines a separation zone surface part of the lower surface of the deposition head which is at a lower level than the parts of the lower surface that bound the precursor gas injection zones, the purge gas injection zones and the gas exhaust zones.

14. The atomic layer deposition apparatus according to claim 1, wherein the distance between the lower surface and the upper surface is in the range of 0.3-7.0 mm and preferably in the range of 0.4-5.0 mm and more preferably in the range of 0.5-2.0 mm.

15. The atomic layer deposition apparatus according to claim 1, wherein the precursor gas injection zones, the purge gas injection zones and/or the gas exhaust zones are substantially wedge shaped, wherein a radially inner side of the wedge shaped zone substantially extends along a segment of a circle having a center point that coincides with the central deposition head axis and having a first radius, wherein a radially outer side of the wedge shaped zone substantially extends along a segment of a circle having a center point that coincides with the central deposition head axis and having a second radius which is larger than the first radius, wherein two other sides of each wedge shaped zone extend substantially in a radial direction relative to the central deposition head axis from the radially inner side to the radially outer side of the wedge shape zone.

16. The atomic layer deposition apparatus according to claim 1, wherein the lower surface of the deposition head, when viewed from the central deposition head axis in a radially outward direction, is inclined in an upward direction, such that the gap between the lower surface and the upper surface is larger at a larger diameter than at a smaller diameter.

17. The atomic layer deposition apparatus according to claim 16, wherein the inclination includes an angle with an upwardly extending part of the central deposition head axis between 80° and 90°, and preferably between 85° and 90°.

18. The atomic layer deposition apparatus according to claim 1, wherein at least one of the deposition head and the susceptor is upwardly and downwardly movably mounted along the central deposition head axis, such that the distance between the upper surface and the lower surface is adjustable.

19. The atomic layer deposition apparatus according to claim 1,
wherein the at least two feed-through channels include: at least two precursor gas feed-through channels and a purge gas feed-through channel, wherein the at least two precursor gas feed-through channels are each connected to the plurality of precursor gas injection openings of an associated one of the at least one precursor gas injection zone and wherein the purge gas feed-through channel is connected to the plurality of purge gas injection openings,
wherein an outer cylindrical surface of a part of the deposition head shaft that is bounded by the annular slit comprises:
the at least two annular precursor gas grooves in which an upper part of an associated one of the at least two precursor gas feed-through channels terminates, and
an annular purge gas groove in which an upper part of the purge gas feed-through channel terminates and that is positioned between the at least two precursor gas grooves; and
wherein the deposition head shaft sleeve comprises:
at least two precursor gas feed channels that are positioned at the same horizontal level as and emanate in an associated one of the at least two precursor gas channels, so that, during operation, at least two precursor gases may be supplied to the associated ones of the at least two precursor gas feed-through channels, and
a purge gas feed channel that is positioned at the same horizontal level as and emanates in the purge gas groove, so that, during operation, purge gas may be supplied to the purge gas feed-through channel.

20. The atomic layer deposition apparatus according to claim 15, wherein the deposition head shaft comprises at least two annular exhaust grooves of which a first one is positioned between the purge gas groove and a first one of the at least two precursor gas grooves and of which a second one is positioned between the purge gas groove and a second one of the at least two precursor gas grooves and wherein the deposition head shaft sleeve includes exhaust gas channels that emanate in exhaust grooves.

21. The atomic layer deposition apparatus according to claim 20, wherein:
the deposition head shaft is provided with at least one gas exhaust channel that extends at least partially parallel to the central deposition head axis, wherein the gas exhaust channel is connected to the plurality of gas exhaust openings; and
the susceptor comprises a susceptor shaft that extends downwardly relative the upper surface and is coaxial with the susceptor axis, wherein the susceptor shaft and a lower part of the deposition head shaft are provided with a gas exhaust channel that extends at least partially parallel to the susceptor axis, wherein the gas exhaust channel is in fluid connection with the plurality of gas exhaust openings.

22. The atomic layer deposition apparatus according to claim 15, wherein the deposition head shaft is provided with at least one gas exhaust channel that extends at least partially parallel to the central deposition head axis, wherein the gas exhaust channel is connected to the plurality of gas exhaust openings.

23. The atomic layer deposition apparatus according to claim 15, wherein the susceptor comprises a susceptor shaft that extends downwardly relative the upper surface and is coaxial with the susceptor axis, wherein the susceptor shaft and a lower part of the deposition head shaft are provided with a gas exhaust channel that extends at least partially parallel to the susceptor axis, wherein the gas exhaust channel is in fluid connection with the plurality of gas exhaust openings.

24. The atomic layer deposition apparatus according to claim 1, wherein the plurality of precursor gas injection zones is provided with precursor gas injection channels that have end portions that form the precursor gas injection openings in the lower surface, wherein the plurality of purge gas injection zones is provided with purge gas injection channels that have end portions that form the purge gas injection openings in the lower surface, wherein the cross-sectional dimension of the end portion of each precursor gas injection channel and/or of each purge gas injection channel increases, when viewed in a flow direction within a said channel so that the end portion diverges.

25. The atomic layer deposition apparatus according to claim 1, wherein the plurality of precursor gas injection zones is provided with precursor gas injection channels that have end portions that form the precursor gas injection openings in the lower surface, wherein the end portions of the precursor gas injection channels include a sharp angle with the lower surface, and wherein the plurality of purge gas injection zones is provided with purge gas injection channels that have end portions that form the purge gas injection openings in the lower surface, wherein the end portions of the purge gas injection channels include a sharp angle with the lower surface.

26. The atomic layer deposition apparatus according to claim 1, wherein the susceptor is rotatable around a susceptor axis that is collinear with the central deposition head axis, the susceptor including a susceptor drive for indexing the susceptor around the susceptor axis between subsequent indexing positions.

27. The atomic layer deposition apparatus according to claim 26, wherein the upper surface includes a limited number of substrate support positions, wherein in each indexing position of the susceptor at least one of said substrate positions is accessible by a substrate loading assembly.

28. The atomic layer deposition apparatus according to claim 26, wherein a controller for the susceptor drive is configured to keep the susceptor stationary during deposition.

29. The atomic layer deposition apparatus according to claim 1, comprising:
- a precursor gas source of a first precursor gas, fluidly connected to a first subset of the plurality of precursor gas injection openings for forming the first precursor gas injection zones;
- a precursor gas source of a second precursor gas, fluidly connected to a second subset of the plurality of precursor gas injection openings for forming the second precursor gas injection zones;
- a purge gas source, fluidly connected to the plurality of purge gas injection openings for forming the purge gas injection zones;
- a vacuum pump, fluidly connected to the plurality of gas exhaust openings for forming the gas exhaust zones.

30. The atomic layer deposition apparatus according to claim 29, wherein the purge gas zones have a purge gas injection zone inner part and a purge gas injection zone outer part that is positioned radially outward from the purge gas injection zone inner part, wherein the purge gas injection zone inner part is connected to an inner purge gas source and the purge gas injection zone outer part is connected to an outer purge gas source that is independently controllable from the inner purge gas source with respect to flow rate and/or pressure; and/or
wherein at least one of the first and the second precursor gas zones have a precursor gas injection zone inner part and an precursor gas injection zone outer part that is positioned radially outward from the precursor gas injection zone inner part, wherein of each precursor gas injection zone having an inner part and an outer part the inner part is connected with an inner precursor gas source and the outer part is connected with an outer precursor gas source, wherein the inner precursor gas source and the outer precursor gas source supply the same type of precursor gas and are independently controllable with respect to flow rate and/or pressure.

31. An assembly of an atomic layer deposition apparatus according to claim 1, and a plurality of substrates that each have an equal thickness, wherein a distance between the lower surface of the deposition head and an upper surface of each substrate that is positioned on the susceptor is in the range of 0.3-7.0 mm, preferably 0.4-5.0 mm and more preferably in the range of 0.5-2.0.

\* \* \* \* \*